US012666796B2

(12) United States Patent
Kim et al.

(10) Patent No.: US 12,666,796 B2
(45) Date of Patent: Jun. 23, 2026

(54) DISPLAY DEVICE

(71) Applicant: Samsung Display Co., LTD., Yongin-si (KR)

(72) Inventors: Taegyun Kim, Yongin-si (KR); Bon-Yong Koo, Yongin-si (KR); Minkyu Woo, Yongin-si (KR); Seon Young Choi, Yongin-si (KR); Mindo Heo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 415 days.

(21) Appl. No.: 18/137,664

(22) Filed: Apr. 21, 2023

(65) Prior Publication Data

US 2024/0032340 A1      Jan. 25, 2024

(30) Foreign Application Priority Data

Jul. 19, 2022      (KR) ........................ 10-2022-0088806

(51) Int. Cl.
*H10K 59/121* (2023.01)
*G06F 1/16* (2006.01)
(Continued)

(52) U.S. Cl.
CPC ....... *H10K 59/1213* (2023.02); *G06F 1/1616* (2013.01); *G06F 1/1652* (2013.01);
(Continued)

(58) Field of Classification Search
CPC ............. H10K 59/1213; H10K 59/131; H10K 2102/311; G06F 1/1616; G06F 1/1652;
(Continued)

(56) References Cited

U.S. PATENT DOCUMENTS

| | | | | |
|---|---|---|---|---|
| 10,345,856 | B2 * | 7/2019 | Song ...................... | H05K 1/028 |
| 2018/0040680 | A1 | 2/2018 | Cai | |
| 2021/0407344 | A1 * | 12/2021 | Lee ...................... | H10K 59/878 |

FOREIGN PATENT DOCUMENTS

| | | |
|---|---|---|
| CN | 112863332 A | 5/2021 |
| KR | 1020170065712 A | 6/2017 |

(Continued)

*Primary Examiner* — Jay C Kim
*Assistant Examiner* — Woo K Lee
(74) *Attorney, Agent, or Firm* — CANTOR COLBURN LLP

(57) ABSTRACT

A display device includes a support plate including first to third regions, and a display panel divided into first to third display regions overlapping the first to third regions, and including light emitting elements (LEs) and pixel circuits (PCs). The second display region includes a first partial region in which first and second PCs, and a first LE are disposed, and a second partial region in which a second LE is disposed. The third display region includes a third partial region in which third and fourth PCs, and a third LE are disposed to overlap a first support portion of the third region, and a fourth partial region in which a fourth LE is disposed to overlap each opening in the third region. A first separation distance between the second PC and the second LE is less than a second separation distance between the fourth PC and the fourth LE.

22 Claims, 28 Drawing Sheets

(51) Int. Cl.
*H04M 1/02* (2006.01)
*H10K 59/131* (2023.01)
*H10K 102/00* (2023.01)

(52) U.S. Cl.
CPC ........ *G06F 1/1656* (2013.01); *H04M 1/0214* (2013.01); *H04M 1/0268* (2013.01); *H10K 59/131* (2023.02); *H10K 2102/311* (2023.02)

(58) Field of Classification Search
CPC .. G06F 1/1656; H04M 1/0214; H04M 1/0268
See application file for complete search history.

(56) References Cited

FOREIGN PATENT DOCUMENTS

| KR | 1020180062272 A | 6/2018 |
| KR | 1020220002005 A | 1/2022 |
| KR | 1020220011841 A | 2/2022 |

* cited by examiner

DISPLAY DEVICE

This application claims priority to Korean Patent Application No. 10-2022-0088806, filed on Jul. 19, 2022, and all the benefits accruing therefrom under 35 U.S.C. § 119, the content of which in its entirety is herein incorporated by reference.

BACKGROUND

1. Field

The disclosure herein relates to a display device, and more particularly, to a display device with an appearance that changes based on an operation mode.

2. Description of the Related Art

Electronic devices such as smart phones, tablet computers, laptop computers, automotive navigation system units, and smart televisions are being developed. Such electronic devices are typically provided with a display device to provide information.

In order to improve user experience and user interface, display devices are being developed in various shapes. Among the display devices, flexible display devices are being actively developed.

SUMMARY

Embodiments of the disclosure provide a display device which has improved impact resistance properties, and which may prevent the occurrence of visibility limitations at a boundary portion thereof.

An embodiment of the invention provides a display device including a support plate including a first region, a second region adjacent to the first region, and a third region adjacent to the second region, where a plurality of first openings is defined in the third region, and the third region includes a first support portion between adjacent first openings of the plurality of first openings, and a display panel divided into a first display region overlapping the first region, a second display region overlapping the second region, and a third display region overlapping the third region, where the display panel including a plurality of light emitting elements and a plurality of pixel circuits. In such an embodiment, the second display region includes a first partial region in which a first pixel circuit, a second pixel circuit, and a first light emitting element are disposed, and a second partial region in which a second light emitting element is disposed. In such an embodiment, the third display region includes a third partial region in which a third pixel circuit, a fourth pixel circuit, and a third light emitting element are disposed and which overlaps at least a portion of the first support portion, and a fourth partial region in which a fourth light emitting element is disposed, and which overlaps each of the plurality of first openings. In such an embodiment, a first separation distance between the second pixel circuit and the second light emitting element is less than a second separation distance between the fourth pixel circuit and the fourth light emitting element.

In an embodiment, the first region and the second region may be defined by flat portions of the support plate, which are integrally formed with each other as a single unitary and indivisible part.

In an embodiment, a plurality of second openings may be defined in the second region, the second region may include a second support portion between adjacent second openings of the plurality of second openings, and a width of each of the plurality of second openings in a first direction may be less than a width of each of the plurality of first openings in the first direction.

In an embodiment, the first partial region may overlap at least a portion of the second support portion, and the second partial region may overlap each of the plurality of second openings.

In an embodiment, the plurality of pixel circuits may further include a fifth pixel circuit and a fifth light emitting element electrically connected to the fifth pixel circuit, and the fifth pixel circuit and the fifth light emitting element may be disposed in the first display region.

In an embodiment, the planar area of the fifth pixel circuit may be substantially the same as the planar area of each of the first pixel circuit to the fourth pixel circuit.

In an embodiment, an arrangement of light emitting elements in the first display region may be substantially the same as an arrangement of light emitting elements in the second display region and an arrangement of light emitting elements in the third display region.

In an embodiment, a density of pixel circuits in the first display region is defined as a first circuit density, a density of pixel circuits in the first partial region is defined as a second circuit density, a density of pixel circuits in the second partial region is defined as a third circuit density, and the first circuit density may be less than the second circuit density, and greater than the third circuit density.

In an embodiment, a density of pixel circuits in the third partial region is defined as a fourth circuit density, a density of pixel circuits in the fourth partial region is defined as a fifth circuit density, and the first circuit density may be less than the fourth circuit density, and greater than the fifth circuit density.

In an embodiment, the display panel may further include a first dummy pixel circuit disposed in the second partial region, and a second dummy pixel circuit disposed in the fourth partial region.

In an embodiment, a density of pixel circuits in the first partial region is defined as a second circuit density, a density of first dummy pixel circuits in the second partial region is defined as a first dummy pixel density, and the second circuit density and the first dummy circuit density may be substantially the same as each other.

In an embodiment, a density of pixel circuits in the third partial region is defined as a fourth circuit density, a density of second dummy pixel circuits in the fourth partial region is defined as a second dummy pixel density, and the fourth circuit density and the second dummy circuit density may be substantially the same as each other.

In an embodiment, the width of the third partial region in a first direction may be greater than the width of the first partial region in the first direction.

In an embodiment, the display panel may further include a first connection line connected between the second pixel circuit and the second light emitting element, and a second connection line connected between the fourth pixel circuit and the fourth light emitting element, where each of the first connection line and the second connection line may be disposed in a different layer from the layer in which an anode of each of the second light emitting element and the fourth light emitting element is disposed, and an extension length of the second connection line in a first direction may be greater than an extension length of the first connection line in the first direction.

In an embodiment, a pixel circuit may not be disposed in each of the second partial region and the fourth partial region.

In an embodiment, the third region and the third display region may be unfolded in a first mode, and folded in a second mode.

In an embodiment, each of the first region to the third region may be provided in plural, and each of a plurality of third regions may be disposed between two adjacent second regions among a plurality of second regions.

In an embodiment, the support plate may include a metal.

In an embodiment, the first support portion of the support plate may include a plurality of first extension portions arranged in a first direction and extending in a second direction crossing the first direction, and a second extension portions disposed between adjacent first extension portions among the plurality of first extension portions, and extending in the first direction.

In an embodiment, the first extension portions and the second extension portions may define a grid shape.

In an embodiment of the invention, a display device includes a support plate including a first region, a second region adjacent to the first region, and a third region adjacent to the second region, where a plurality of first openings is defined in the third region, and the third region includes a first support portion between adjacent first openings of the plurality of first openings, and a display panel including a first display region overlapping the first region, a second display region overlapping the second region, and a third display region overlapping the third region, where the display panel includes a plurality of light emitting elements and a plurality of pixel circuits. In such an embodiment, the plurality of pixel circuits include a first pixel circuit, a second pixel circuit, a third pixel circuit, and a fourth pixel circuit. In such an embodiment, the plurality of light emitting elements include a first light emitting element connected to the first pixel circuit, a second light emitting element connected to the second pixel circuit, a third light emitting element connected to the third pixel circuit, and a fourth light emitting element connected to the fourth pixel circuit. In such an embodiment, the second display region includes a first partial region in which the first pixel circuit, the second pixel circuit, and the first light emitting element are disposed, and a second partial region in which the second light emitting element is disposed, and the third display region includes a third partial region in which the third pixel circuit, the fourth pixel circuit, and the third light emitting element are disposed and which overlaps at least a portion of the first support portion, and a fourth partial region in which the fourth light emitting element is disposed, and which overlaps each of the plurality of first openings. In such an embodiment, an arrangement of light emitting elements in the first display region is substantially the same as an arrangement of light emitting elements in the second display region and an of light emitting elements in the third display region, and a width of the third partial region in a first direction is greater than a width of the first partial region in the first direction.

In an embodiment of the invention, a display device includes a display panel divided into a first region, a second region, and a third region sequentially disposed along one direction, where the display panel includes a plurality of light emitting elements and a plurality of pixel circuits. In such an embodiment, the first region has a constant shape when an operation mode changes, and the third region has a shape which changes according to a change of the operation mode. In such an embodiment, the plurality of pixel circuits include a first pixel circuit, a second pixel circuit, a third pixel circuit, and a fourth pixel circuit, and the plurality of light emitting elements include a first light emitting element connected to the first pixel circuit, a second light emitting element connected to the second pixel circuit, a third light emitting element connected to the third pixel circuit, and a fourth light emitting element connected to the fourth pixel circuit. In such an embodiment, the second region includes a first partial region in which the first pixel circuit, the second pixel circuit, and the first light emitting element are disposed, and a second partial region in which the second light emitting element is disposed. In such an embodiment, the third region includes a third partial region in which the third pixel circuit, the fourth pixel circuit, and the third light emitting element are disposed, and a fourth partial region in which the fourth light emitting element is disposed. In such an embodiment, a first separation distance between the second pixel circuit and the second light emitting element is less than a second separation distance between the fourth pixel circuit and the fourth light emitting element.

BRIEF DESCRIPTION OF THE DRAWINGS

The above and other features of the invention will become more apparent by describing in further detail embodiments thereof with reference to the accompanying drawings, in which:

FIG. 5A is a cross-sectional view of a display device according to an embodiment of the invention;

FIG. 11A to FIG. 11C are perspective views of an electronic device according to an embodiment of the invention.

DETAILED DESCRIPTION

Figure 1A:
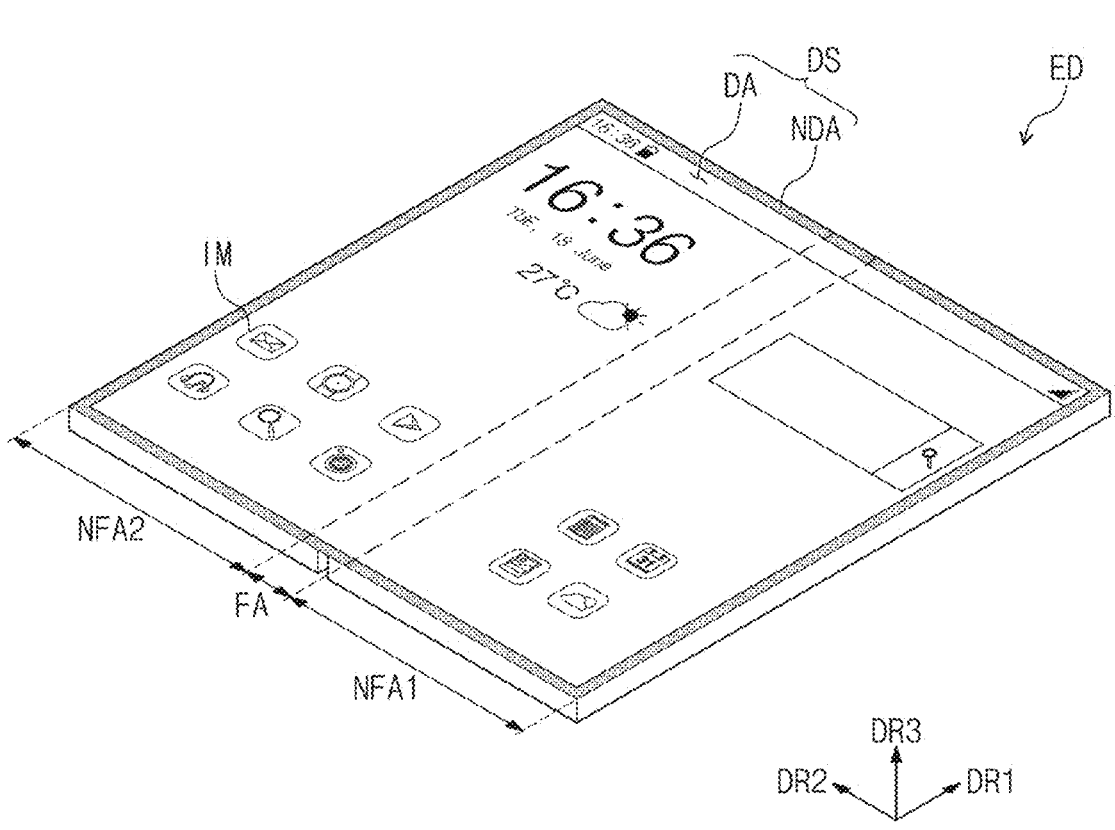
FIG. 1A to FIG. 1C are perspective views of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, when an element (or an area, a layer, a portion, etc.) is referred to as being "on," "connected to," or "coupled to" another element, it means that the element may be directly connected to/coupled to the other element, or that a third element may be disposed therebetween.

Like reference numerals refer to like elements. Also, in the drawings, the thickness, the ratio, and the dimensions of elements are exaggerated for an effective description of technical contents.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing from the teachings herein.

In addition, terms such as "below," "lower," "above," "upper," and the like are used to describe the relationship of components shown in the drawings. The terms are used as a relative concept and are described with reference to the direction indicated in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the disclosure, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers or two members.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It is also to be understood that terms such as terms defined in commonly used dictionaries should be interpreted as having meanings consistent with the meanings in the context of the related art, and should not be interpreted in too ideal a sense or an overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
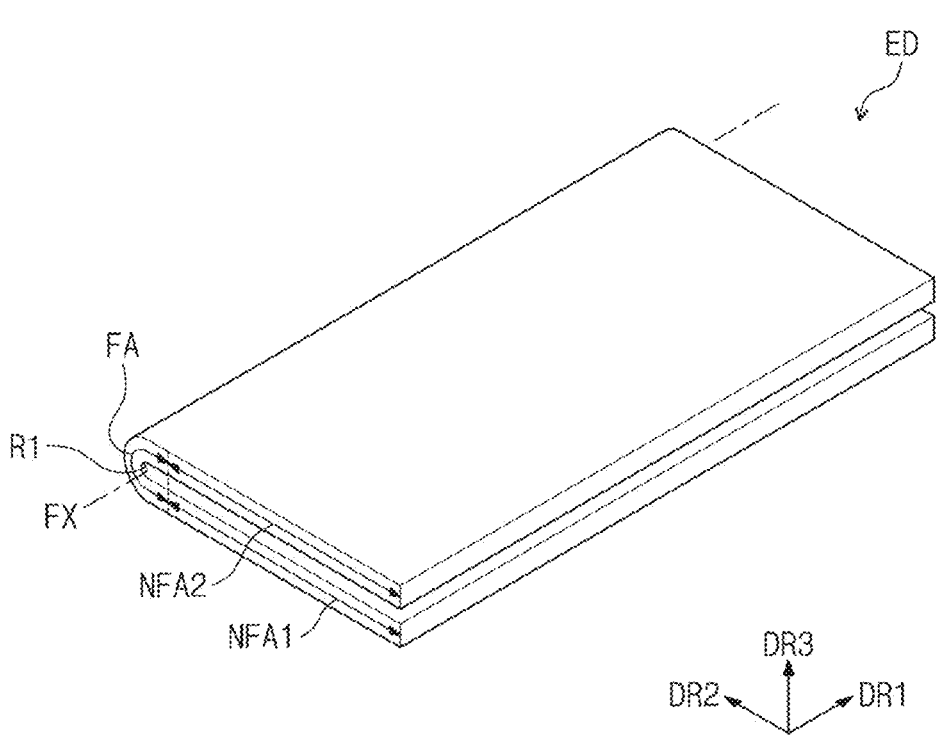
Figure 1C:
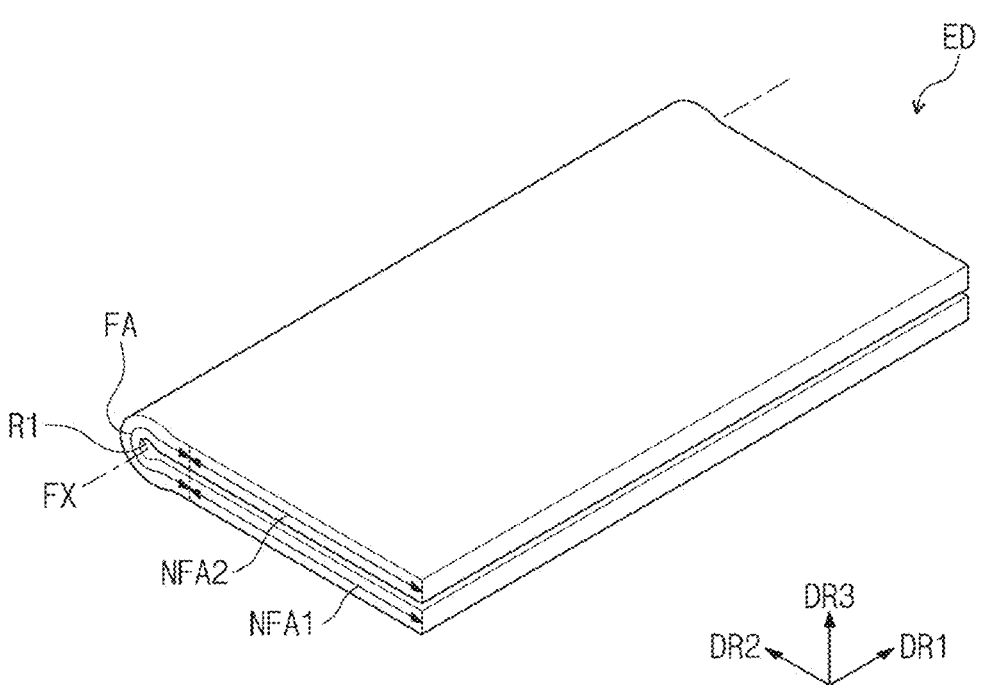

FIG. 1A to FIG. 1C are perspective views of an electronic device according to an embodiment of the invention. FIG. 1A illustrates an electronic device ED of an embodiment in an unfolded state, and FIG. 1B and FIG. 1C illustrate the electronic device ED of an embodiment in a folded state.

Referring to FIG. 1A to FIG. 1C, the electronic device ED according to an embodiment of the invention may include a display surface DS on a plane defined by a first direction DR1 and a second direction DR2 crossing the first direction DR1. The electronic device ED may provide an image IM to a user through the display surface DS.

The display surface DS may include a display region DA and a non-display region NDA around the display region DA. The display region DA may display the image IM, and the non-display region NDA may not display the image IM. The non-display region NDA may surround the display region DA. However, the embodiment of the invention is not limited thereto. The shape of the display region DA, and a shape of the non-display region NDA may be variously modified.

Hereinafter, a direction substantially perpendicularly crossing the plane defined by the first direction DR1 and the second direction DR2 is defined as a third direction DR3. The third direction DR3 may be a thickness direction of the electronic device ED. The third direction DR3 becomes a reference that distinguishes the front surface and the rear surface of each member. In the disclosure, "on a plane" may be defined as a state viewed in the third direction DR3.

The electronic device ED may include a folding region FA and a plurality of non-folding regions NFA1 and NFA2. The non-folding regions NFA1 and NFA2 may include a first non-folding region NFA1 and a second non-folding region NFA2. In the second direction DR2, the folding region FA may be disposed between the first non-folding region NFA1 and the second non-folding region NFA2.

The electronic device ED in a first mode may be defined as the electronic device ED in an unfolded state, and the electronic device ED in a second mode may be defined as the electronic device ED in a folded state. As the electronic device ED changes from the first mode to the second mode, the shape of the folding region FA changes, but the shapes of the non-folding regions NFA1 and NFA2 do not change.

As illustrated in FIG. 1B, in an embodiment, the folding region FA may be folded with respect to a folding axis FX parallel to the first direction DR1. The folding region FA has a predetermined curvature and a predetermined radius of curvature R1. The first non-folding region NFA1 and the second non-folding region NFA2 face each other, and the electronic device ED may be inner-folded such that the display surface DS is not exposed to the outside.

In an embodiment of the invention, the electronic device ED may be outer-folded such that the display surface DS is exposed to the outside. In an embodiment of the invention, the electronic device ED may be configured in a way such that an inner-folding or outer-folding operation may be alternatively repeated from an un-folding operation, but the embodiment of the invention is not limited thereto. In an embodiment of the invention, the electronic device ED may be configured to selectively perform one of the un-folding operation, the inner-folding operation, and the outer-folding operation.

In an embodiment, as illustrated in FIG. 1B, the distance between the first non-folding region NFA1 and the second non-folding region NFA2 may be substantially the same as two times the radius of curvature R1 in a folded state. In an alternative embodiment, as illustrated in FIG. 1C, the distance between the first non-folding region NFA1 and the second non-folding region NFA2 may be less than two times the radius of curvature R1 in a folded state. FIG. 1B and FIG. 1C are illustrated with respect to the display surface DS, and a housing HM (see FIG. 2) forming the appearance of the electronic device ED may be in contact in end regions of the first non-folding region NFA1 and the second non-folding region NFA2.

Figure 2:
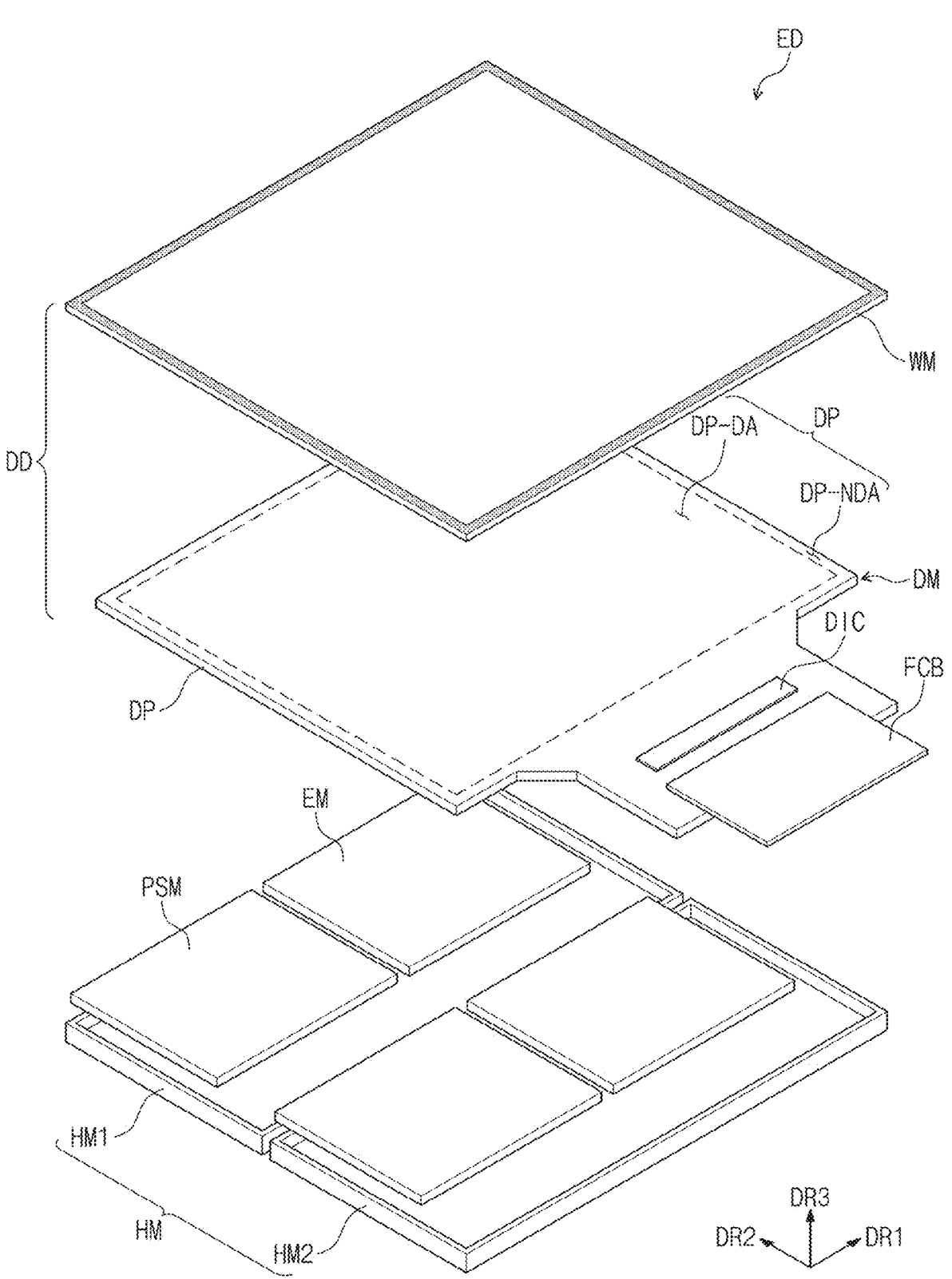
FIG. 2 is an exploded perspective view of an electronic device according to an embodiment of the invention.

FIG. 2 is an exploded perspective view of an electronic device according to an embodiment of the invention.

As illustrated in FIG. 2, an embodiment of the electronic device ED may include a display device DD, an electronic module EM, a power module PSM, and the housing HM. Although not separately illustrated, the electronic device ED may further include an instrument structure for controlling a folding operation of the display device DD.

The display device DD generates an image and senses an external input. The display device DD includes a window WM and a display module DM. The window WM define the front surface of the electronic device ED.

The display module DM may include at least the display panel DP. FIG. 2A illustrates only the display panel DP among laminated structures of the display module DM, but the display module DM may substantially further include a plurality of components disposed on an upper side of the display panel DP. The laminate structure of the display module DM will be described in detail later.

The display panel DP is not particularly limited, and may be, for example, a light emitting-type display panel such as an organic light emitting display panel or an inorganic light emitting display panel.

The display panel DP includes a display region DP-DA and a non-display region DP-NDA respectively corresponding to the display region DA (see FIG. 1A) and the non-display region NDA (see FIG. 1A) of the electronic device ED. In the disclosure, when "a region/portion corresponds to a region/portion," it means that the region/portion overlaps the region/portion, and the regions/portions are not limited to having the same area.

In an embodiment, as illustrated in FIG. 2, a driving chip DIC may be disposed on the non-display region DP-NDA of the display panel DP. A flexible circuit board FCB may be coupled to the non-display region DP-NDA of the display panel DP. The flexible circuit board FCB may be connected to a main circuit board. The main circuit board may be one electronic component constituting the electronic module EM.

The driving chip DIC may include driving elements for driving a pixel of the display panel DP, for example, a data driving circuit. FIG. 2 illustrates an embodiment having a structure in which the driving chip DIC is mounted on the display panel DP, but the invention is not limited thereto. In an alternative embodiment, for example, the driving chip DIC may be mounted on the flexible circuit board FCB.

The electronic module EM may include a control module, a wireless communication module, an image input module, a sound input module, a sound output module, a memory, an external interface module, or the like. The electronic module EM may include the main circuit board, and the modules listed above may be mounted on the main circuit board, or may be electrically connected to the main circuit board through a flexible circuit board. The electronic module EM is electrically connected to the power module PSM.

Referring to FIG. 2, the electronic module EM is disposed in each of a first housing HM1 and a second housing HM2, and the power module PSM may be disposed in each of the first housing HM1 and the second housing HM2. Although not illustrated, the electronic module EM disposed in the first housing HM1, and the electronic module EM disposed in the second housing HM2 may be electrically connected through a flexible circuit board.

Although not separately illustrated, the electronic device ED may further include an electronic optical module. The electronic optical module may be an electronic component configured to output or receive an optical signal. The electronic optical module may include a camera module and/or a proximity sensor. The camera module may capture external images through some regions of the display panel DP.

The housing HM illustrated in FIG. 2 is coupled to the display device DD, particularly the window WM, to accommodate the above other modules. The housing HM is illustrated as including the first and second housings HM1 and HM2 separated from each other, but the embodiment of the invention is not limited thereto. Although not illustrated, the electronic device ED may further include a hinge structure for connecting the first and second housings HM1 and HM2.

Figure 3:
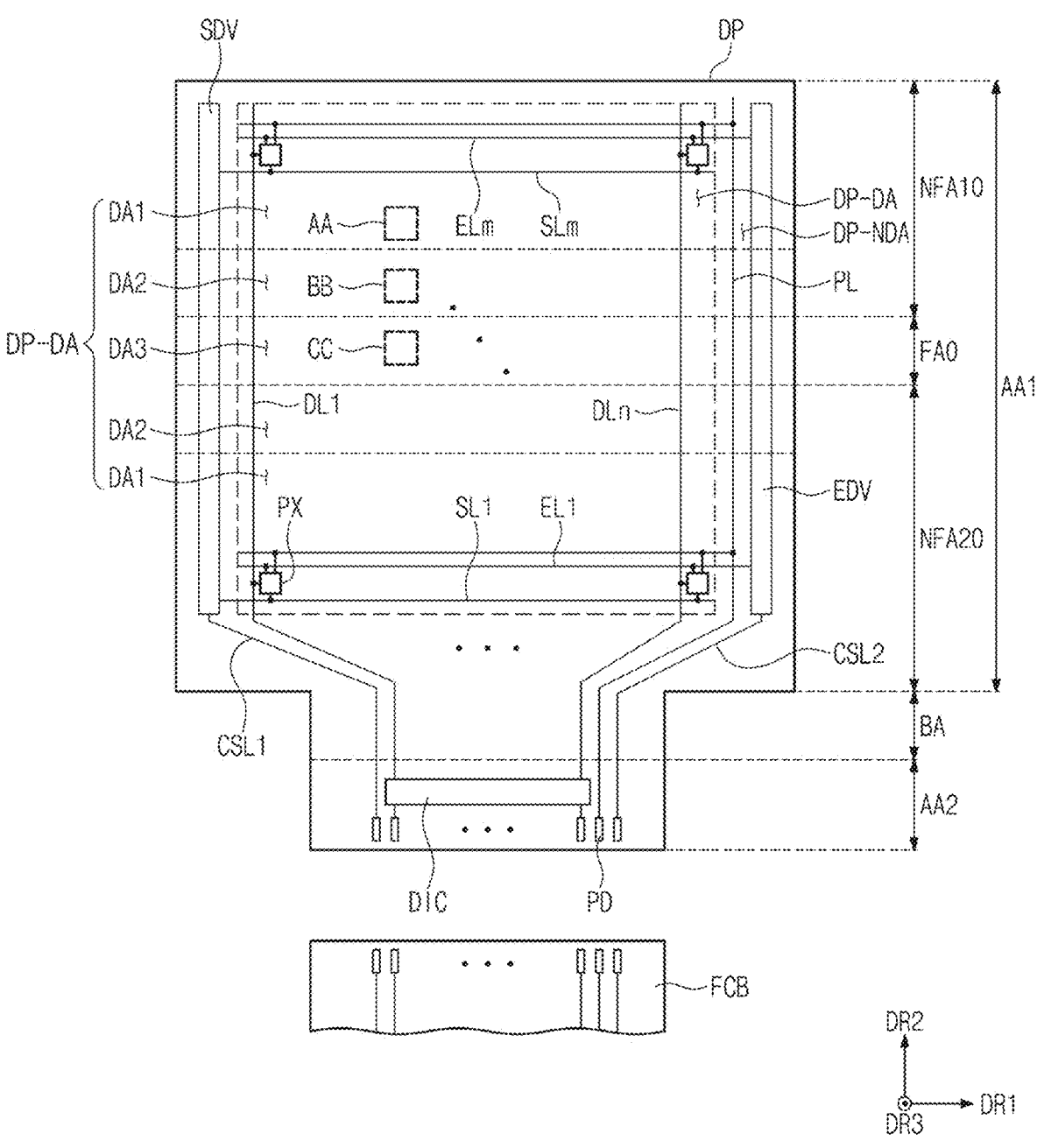
FIG. 3 is a plan view of a display panel according to an embodiment of the invention.

FIG. 3 is a plan view of a display panel according to an embodiment of the invention.

Referring to FIG. 3, an embodiment of the display panel DP may include the display region DP-DA and the non-display region DP-NDA around the display region DP-DA. A pixel PX is disposed in the display region DP-DA. A scan driver SDV, a data driver, and a light emitting driver EDV may be disposed in the non-display region DP-NDA. The data driver may be a part of circuits configured in the driving chip DIC illustrated in FIG. 3.

The display panel DP includes a first region AA1, a second region AA2, and a bending region BA, which are arranged in the second direction DR2. The second region AA2 and the bending region BA may be parts of the non-display region DP-NDA. The bending region BA is disposed between the first region AA1 and the second region AA2.

The first region AA1 is a region corresponding to the display surface DS of FIG. 1A. The first region AA1 may include a first non-folding region NFA10, a second non-folding region NFA20, and a folding region FA0. The first non-folding region NFA10, the second non-folding region NFA20, and the folding region FA0 respectively correspond to the first non-folding region NFA1, the second non-folding region NFA2, and the folding region FA of FIG. 1A to FIG. 1C.

In an embodiment, the display region DP-DA includes two display regions, i.e., a first display region DA1 and a second display region DA2, corresponding to the first non-folding region NFA10. The display region DP-DA includes a third display region DP3 corresponding to the folding region FA0. The display region DP-DA includes two display regions, i.e., the first display region DA1 and the second display region DA2, corresponding to the second non-folding region NFA20. The second display regions DA2 may be regions more adjacent to the third display region DA3 than the first display regions DA1 are. In an embodiment, a first display region DA1, a second display region DA2, a third display region DA3, a second display region DA2, and a first display region DA1 may be sequentially arranged in the display panel DP along the second direction DR2.

In an embodiment, the length of the bending region BA in the first direction DR1 and the length of the second region AA2 in the first direction DR1 may be less than the length of the first region AA1 in the first direction DR1. In such an embodiment, the bending region BA is a region having a short length in a bending axis direction such that the bending region BA may be more easily bent.

The display panel DP may include a plurality of pixels PX, a plurality of scan lines SL1 to SLm, a plurality of data lines DL1 to DLn, a plurality of light emission lines EL1 to ELm, first and second control lines CSL1 and CSL2, a power line PL, and a plurality of pads PD. Here, m and n are natural numbers. The pixels PX may be connected to the scan lines SL1 to SLm, the data lines DL1 to DLn, and the light emission lines EL1 to ELm.

The scan lines SL1 to SLm may extend in the second direction DR2, and connected to the scan driver SDV. The data lines DL1 to DLn may extend in the second direction DR2, and connected to the driving chip DIC via the bending region BA. The light emission lines EL1 to ELm may extend in the first direction DR1, and connected to the light emission driver EDV.

The power line PL may include a portion extending in the second direction DR2 and a portion extended in the first direction DR1. The portion extended in the first direction DR1 and the portion extending in the second direction DR2 may be disposed in (or directly on) different layers from each other. The portion of the power line PL extending in the second direction DR2 may be extended to the second region AA2 via the bending region BA. The power line PL may provide a first voltage to the pixels PX.

The first control line CSL1 is connected to the scan driver SDV, and may extend toward a lower end of the second region AA2 via the bending region BA. The second control line CSL2 is connected to the light emission driver EDV, and may extend toward the lower end of the second region AA2 via the bending region BA.

On a plane, the pads PD may be disposed adjacent to the lower end of the second region AA2. The driving chip DIC, the power line PL, the first control line CSL1, and the second control line CSL2 may be connected to the pads PD. The flexible circuit board FCB may be electrically connected to the pads PD through an anisotropic conductive adhesive layer.

Figure 4:
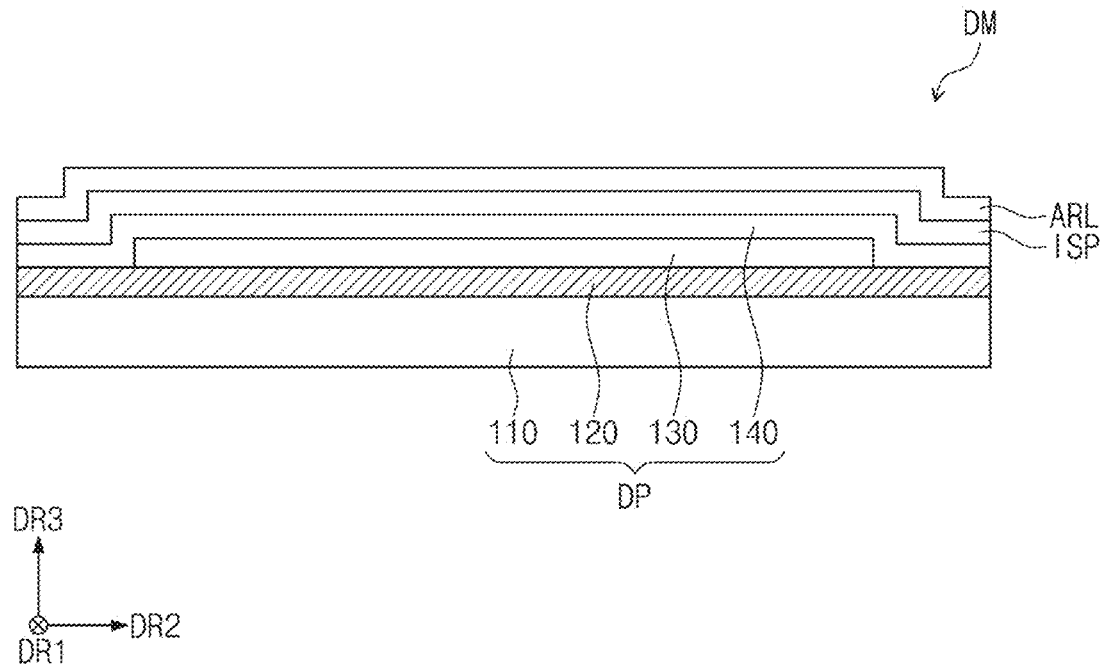
FIG. 4 is a cross-sectional view of a display module according to an embodiment of the invention.

FIG. 4 is a cross-sectional view of a display module according to an embodiment of the invention.

Referring to FIG. 4, an embodiment of the display module DM may include the display panel DP, an input sensor ISP, and an anti-reflection layer ARL. The display panel DP may include a base layer 110, a circuit layer 120, a light emitting element layer 130, and an encapsulation layer 140.

The base layer 110 may provide a base surface on which the circuit layer 120 is disposed. The base layer 110 may be a flexible substrate capable of bending, folding, rolling, and the like. The base layer 110 may be a glass substrate, a metal substrate, a polymer substrate, or the like. However, the embodiment of the invention is not limited thereto, and alternatively, the base layer 110 may be an inorganic layer, an organic layer, or a composite material layer.

The base layer 110 may have a multi-layered structure. In an embodiment, for example, the base layer 110 may include a first synthetic resin layer, a multi-layered or single-layered inorganic layer, and a second synthetic resin layer disposed on the multi-layered or single-layered inorganic layer. Each of the first and second synthetic resin layers may include a polyimide-based resin, but is not particularly limited thereto.

The circuit layer 120 may be disposed on the base layer 110. The circuit layer 120 may include an insulation layer, a semiconductor pattern, a conductive pattern, a signal line, or the like.

The light emitting element layer 130 may be disposed on the circuit layer 120. The light emitting element layer 130 may include a light emitting element. In an embodiment, for example, the light emitting element may include an organic light emitting material, an inorganic light emitting material, an organic-inorganic light emitting material, a quantum dot, a quantum rod, a micro-light emitting diode (micro-LED), or a nano-light emitting diode (nano-LED).

The encapsulation layer 140 may be disposed on the light emitting element layer 130. The encapsulation layer 140 may protect the light emitting element layer 130 from foreign materials such as moisture, oxygen, and dust particles. The encapsulation layer 140 may include at least one inorganic layer. The encapsulation layer 140 may include a laminate structure of an inorganic layer/an organic layer/an inorganic layer.

The input sensor ISP may be directly disposed on the display panel DP. The input sensor ISP may sense a user's input in a capacitive manner. The display panel DP and the input sensor ISP may be formed through a continuous process. Here, "being directly disposed" may mean that a third component is not disposed between the input sensor ISP and the display panel DP. That is, a separate adhesive layer may not be disposed between the input sensor ISP and the display panel DP.

The anti-reflection layer ARL may be directly disposed on the input sensor ISP. The anti-reflection layer ARL may reduce the reflectance of external light incident from the outside of the display device DD. The anti-reflection layer ARL may include color filters. The color filters may have a predetermined arrangement. In an embodiment, for example, the color filters may be arranged based on an arrangement of light emission colors of pixels included in the display panel DP. In addition, the anti-reflection layer ARL may further include a black matrix adjacent to the color filters.

In an embodiment of the invention, the position of the input sensor ISP and the position of the anti-reflection layer ARL are interchangeable. In an embodiment of the invention, the anti-reflection layer ARL may be substituted with a polarizing film. The polarizing film may be coupled to the input sensor ISP through an adhesive layer.

Figure 5A:
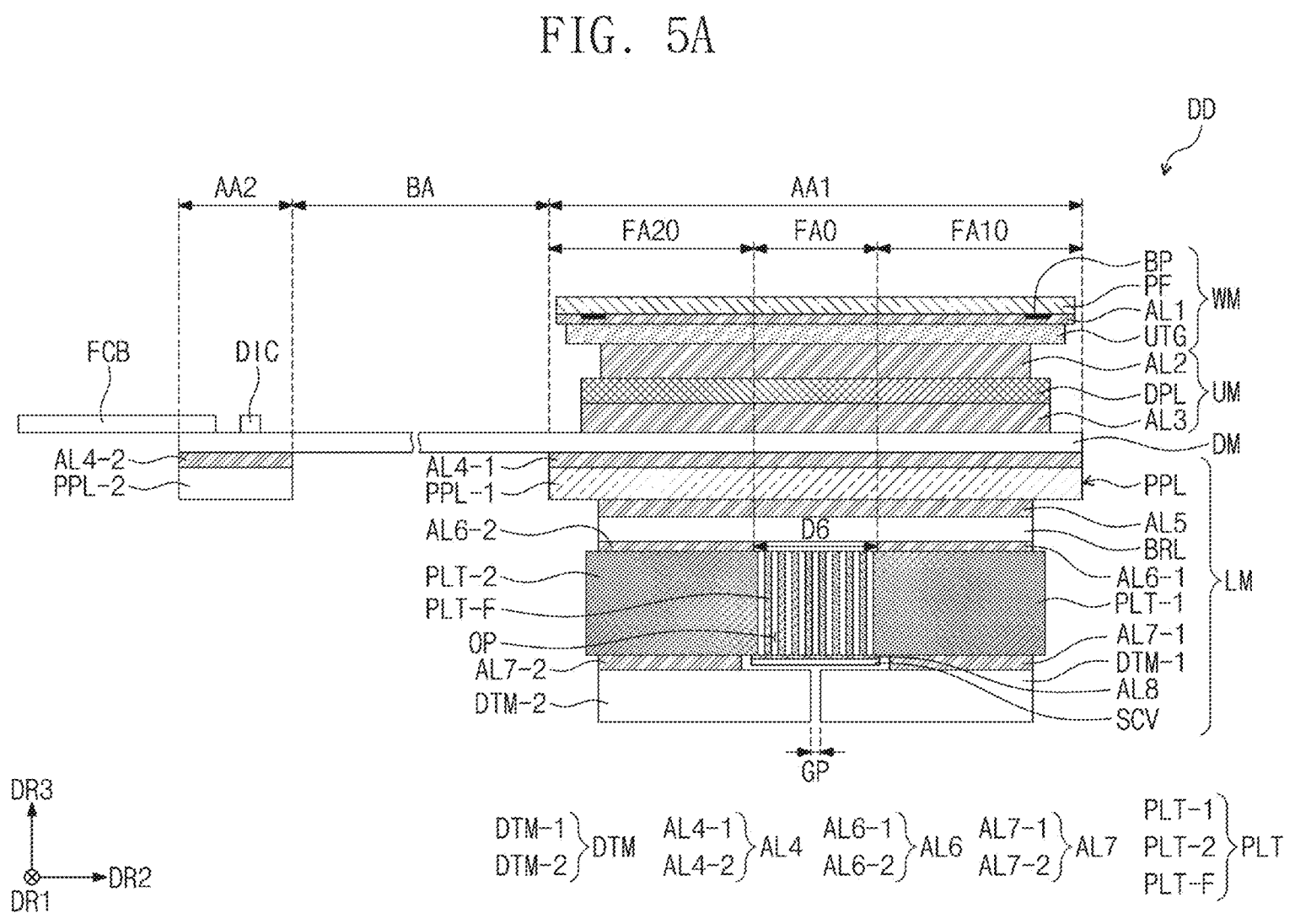
Figure 5B:
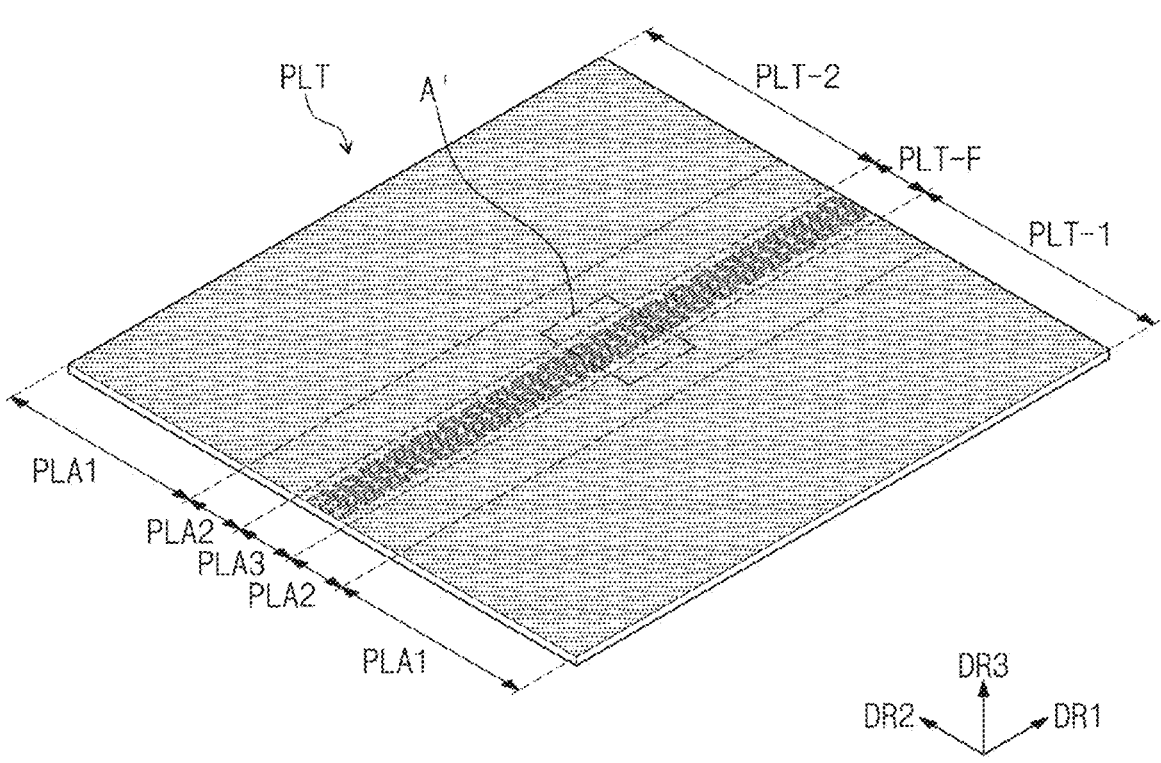
FIG. 5B is a perspective view of a support plate according to an embodiment of the invention.
Figure 5C:
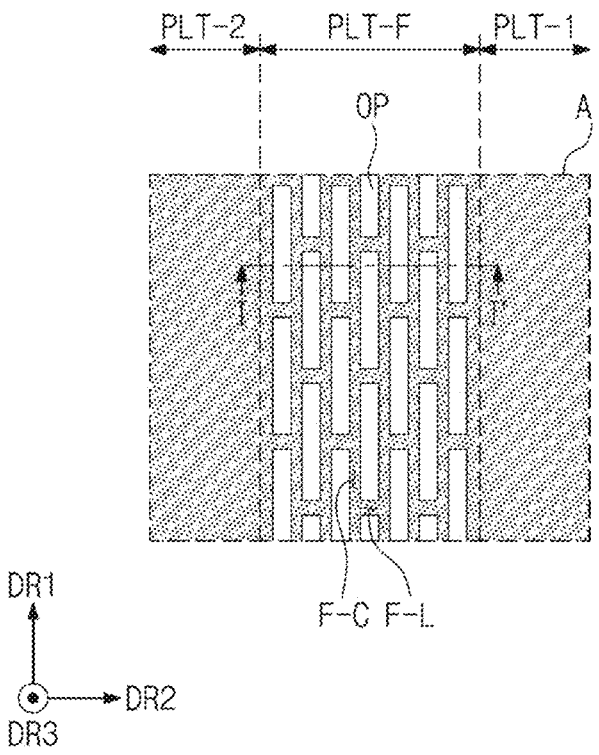
FIG. 5C is an enlarged plan view of a portion of a support plate according to an embodiment of the invention.
Figure 5D:
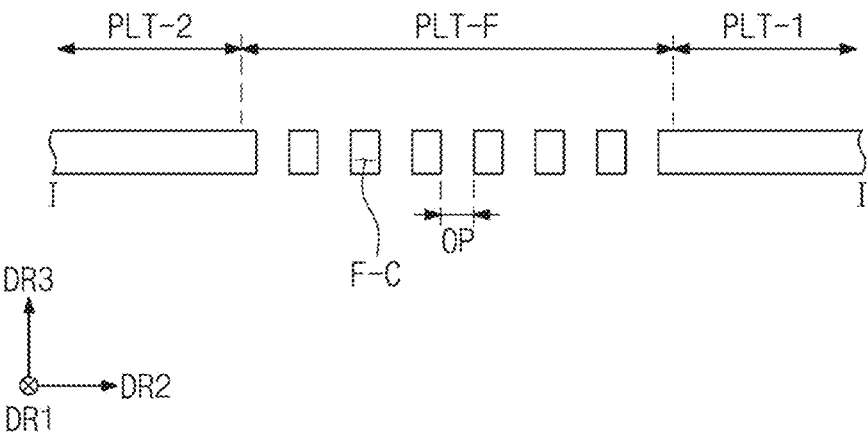
FIG. 5D is a cross-sectional view of a portion of a support plate according to an embodiment of the invention.
Figure 5E:
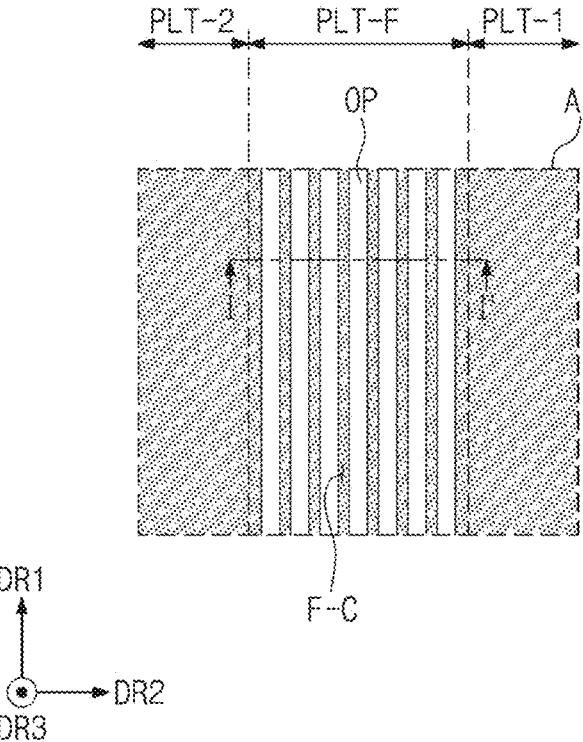
FIG. 5E is an enlarged plan view of a portion of a support plate according to an embodiment of the invention.

FIG. 5A is a cross-sectional view of a display device according to an embodiment of the invention. FIG. 5B is a perspective view of a support plate according to an embodiment of the invention. FIG. 5C is an enlarged plan view of a portion of a support plate according to an embodiment of the invention. FIG. 5D is a cross-sectional view of a portion of a support plate according to an embodiment of the invention. FIG. 5E is an enlarged plan view of a portion of a support plate according to an embodiment of the invention. FIG. 5C illustrates a plane corresponding to region A' of FIG. 5B. FIG. 5D illustrates a cross-section taken along line I-I' of FIG. 5C.

FIG. 5A illustrates an embodiment of the display module DM in an unfolded state in which the display module DM is not folded. In FIG. 5A, regions dividing the display module DM are illustrated with respect to the display panel DP of FIG. 3.

Referring to FIG. 5A, an embodiment of a display device DD includes a window WM, an upper member UM, a display module DM, and a lower member LM. The upper member UM collectively refers to components disposed between the window WM and the display module DM, and the lower member LM collectively refers to components disposed on a lower side of the display module DM.

The window WM may include a thin-film glass substrate UTG, a thin-film window protection layer PF disposed on the thin-film glass substrate UTG, and a bezel pattern BP disposed on a lower surface of the window protection layer PF. In an embodiment, the window protection layer PF may include a synthetic resin film. The window WM may include an adhesive layer AL1 (hereinafter, a first adhesive layer) which couples the window protection layer PF and the thin-film glass substrate UTG to each other.

The bezel pattern BP overlaps the non-display region NDA illustrated in FIG. 1A. The bezel pattern BP may be disposed on one surface of the thin-film glass substrate UTG or on one surface of the window protection layer PF. FIG. 5A exemplarily illustrates an embodiment where the bezel pattern BP is disposed on a lower surface of the window protection layer PF. However, the embodiment of the invention is not limited thereto, and alternatively, the bezel pattern BP may be disposed on an upper surface of the window protection layer PF. The bezel pattern BP is a colored light blocking film, and may be formed, for example, by a coating method. The bezel pattern BP may include a base material and a dye or a pigment mixed in the base material.

The thickness of the thin-film glass substrate UTG may be in a range of approximately 15 micrometers ($\mu$m) to approximately 45 $\mu$m. The thin-film glass substrate UTG may be a chemically reinforced glass. The thin-film glass substrate UTG may minimize the occurrence of wrinkles even when folding and unfolding are repeated.

The thickness of the window protection layer PF may be in a range of approximately 50 $\mu$m to approximately 80 $\mu$m. The synthetic resin film of the window protection layer PF may include polyimide, polycarbonate, polyamide, triacetylcellulose, or polymethylmethacrylate, or polyethylene terephthalate. Although not separately illustrated, at least one selected from a hard coating layer, an anti-fingerprint layer, and an anti-reflection layer may be disposed on the upper surface of the window protection layer PF.

The first adhesive layer AL1 may be a pressure sensitive adhesive (PSA) film or an optically clear adhesive (OCA) member. Adhesive layers to be described below may also include a same adhesive as that of the first adhesive layer AL1.

In an embodiment, the first adhesive layer AL1 may be separated or separable from the thin-film glass substrate UTG to be replaced. Since the strength of the window protection layer PF is lower than that of the thin-film glass substrate UTG, scratches may occur relatively easily in the window protection layer PF. In such an embodiment, after the first adhesive layer AL1 and the window protection layer PF are separated, a new window protection layer PF may be attached to the thin-film glass substrate UTG.

The upper member UM includes an upper film DPL. The upper film DPL may include a synthetic resin film. The synthetic resin film may include polyimide, polycarbonate, polyamide, triacetylcellulose, or polymethylmethacrylate, or polyethylene terephthalate.

The upper film DPL may absorb an external impact applied to the front surface of the display device DD. The display module DM described with reference to FIG. 4 may include the anti-reflection layer ARL which replaces a polarizing film, and due to the anti-reflection layer ARL, the front-surface impact strength (resistance) of the display device DD may be reduced. The upper film DPL may compensate for reduced impact strength by applying the anti-reflection layer ARL. In an alternative embodiment of the invention, the upper film DPL may be omitted. The upper member UM may include a second adhesive layer AL2 which couples the upper film DPL and the window WM to each other, and a third adhesive layer AL3 which couples the upper film DPL and the display module DM to each other.

The lower member LM may include a panel protection layer PPL, a barrier layer BRL, a support plate PLT, a cover layer SCV, and a digitizer DTM, and fourth to eighth adhesive layers AL4 to AL8. In an embodiment of the invention, at least one selected from the above-described components may be omitted. In an embodiment, for example, the barrier layer BRL, the cover layer SCV, or the digitizer DTM, and an adhesive layer related thereto may be omitted.

The panel protection layer PPL may be the disposed on a lower side of the display module DM. The panel protection layer PPL may protect a lower portion of the display module DM. The panel protection layer PPL may include a flexible synthetic resin film. In an embodiment, for example, the panel protection layer PPL may include polyethylene terephthalate.

In an embodiment of the invention, the panel protection layer PPL may not be disposed in the bending region BA. The panel protection layer PPL may include a first panel protection layer PPL-1 for protecting the first region AA1 of the display panel DP (see FIG. 3A) and a second panel protection layer PPL-2 for protecting the second region AA2 thereof.

The fourth adhesive layer AL4 couples the panel protection layer PPL and the display panel DP to each other. The fourth adhesive layer AL4 may include a first portion AL4-1 corresponding to the first panel protection layer PPL-1 and a second portion AL4-2 corresponding to the second panel protection layer PPL-2.

Although not illustrated, when the bending region BA is bent, the second panel protection layer PPL-2 may be disposed together with the second region AA2 on lower portions of the first region AA1 and the first panel protection layer PPL-1. Since the panel protection layer PPL is not disposed in the bending region BA, the bending region BA may be more easily bent.

As illustrated in FIG. 5A, the fifth adhesive layer AL5 couples the panel protection layer PPL and the barrier layer BRL to each other. The barrier layer BRL may be disposed on a lower side of the panel protection layer PPL. The barrier layer BTU, may increase resistance against compressive force caused by external pressing. Therefore, the barrier layer BRL may serve to prevent the deformation of the display panel DP. The barrier layer BRL may include a flexible plastic material such as polyimide or polyethylene terephthalate. In addition, the barrier layer BRL may be a colored film with low light transmittance. The barrier layer BRL may absorb light incident from the outside. In an embodiment, for example, the barrier layer BRL may a black synthetic resin film. When the display device DD is viewed from an upper side of the window protection layer PF, elements disposed on a lower side of the barrier layer BRL may not be visually recognized by a user.

The sixth adhesive layer AL6 couples the barrier layer BRL and the support plate PLT to each other. The sixth adhesive layer AL6 may include a first portion AL6-1 and a second portion AL6-2 spaced apart from each other. A separation distance D6 (or a gap) between the first portion AL6-1 and the second portion AL6-2 corresponds to the width of the folding region FA0, and is greater than a gap GP in the digitizer DTM to be described later.

The support plate PLT is disposed on a lower side of the barrier layer BRL. The support plate PLT supports components disposed on an upper side thereof, and maintains an unfolded state and a folded state of the display device DD. The support plate PLT has greater strength than the barrier layer BRL.

The support plate PLT may include a metal material which has high strength. The support plate PLT may include a material having an elastic modulus of about 60 gigapascals (GPa) or greater. The support plate PLT may include a metal material such as stainless steel.

The support plate PLT may include a reinforced fiber composite material. The support plate PLT may include a reinforced fiber disposed on the inner side of a matrix portion. The reinforced fiber may be a carbon fiber or glass fiber. The matrix portion may include a polymer resin. The matrix portion may include a thermoplastic resin. In an embodiment, for example, the matrix portion may include a polyamide-based resin or polypropylene-based resin. In an embodiment, for example, the reinforced fiber composite material may be carbon fiber reinforced plastic (CFRP) or glass fiber reinforced plastic (GFRP).

Referring to FIG. 5A to FIG. 5D, the support plate PLT includes at least a first support portion PLT-1 corresponding to the first non-folding region NFA10 and a second support portion PLT-2 corresponding to the second non-folding region NFA20. The support plate PLT may include a folding portion PLT-F which corresponds to the folding region FA0, and the folding portion PLT-F is disposed between the first support portion PLT-1 and the second support portion PLT-2, with a plurality of openings OP defined therein. The first support portion PLT-1, the second support portion PLT-2, and the folding portion PLT-F may have a shape of a single body or be integrally formed as a single unitary and indivisible part.

In each of the first support portion PLT-1 and the second support portion PLT-2, a first region PLA1 and a second region PLA2 may be defined. In the folding portion PLT-F, a third region PLA3 may be defined. The first region PLA1 may be a region corresponding to the first display region DA1 in the display region DP-DA of the display panel DP described above with reference to FIG. 3. The second region PLA2 may be a region corresponding to the second display region DA2 in the display region DP-DA of the display panel DP. The third region PLA3 may be a region corresponding to the third display region DA3 in the display region DP-DA of the display panel DP. The first region PLA1 and the second region PLA2 may have a plate shape having a shape of a single body. The first region PLA1 and the second region PLA2 may provide a flat support surface of a single body.

As described with reference to FIG. 1A to FIG. 1C, as the electronic device ED changes from the first mode to the second mode, the shape of the folding portion PLT-F changes, but the shapes of the first support portion PLT-1 and the second support portion PLT-2 do not change. Each of the first support portion PLT-1 and the second support portion PLT-2 provides a flat support surface regardless of an operation mode. The first support portion PLT-1 and the second support portion PLT-2 may be defined as a first region whose shape is not changed according to the change of an operation mode of the electronic device ED, and the folding portion PLT-F may be defined as a second region whose shape is changed according to the change of an operation mode of the electronic device ED.

As illustrated in FIG. 5C, the plurality of openings OP may be defined in a way such that the folding portion PLT-F has a grid shape on a plane. The flexibility of the folding portion PLT-F is improved due to the plurality of openings OP. During the folding operation illustrated in FIG. 1B and FIG. 1C, the folding portion PLT-F may prevent foreign substances from penetrating into an open central region of the barrier layer BRL from the first support portion PLT-1 and the second support portion PLT-2. The flexibility of the folding portion PLT-F is improved due to the plurality of openings OP.

As illustrated in FIG. 5C, the plurality of openings OP may be defined in the folding portion PLT-F. A region excluding the plurality of openings OP is defined as a support region. The support region may include first extension portions F-C and second extension portions F-L. In the disclosure, the first extension portions F-C and the second extension portions F-L are collectively referred to as a "support portion." Each of the first extension portions F-C extends in the first direction DR1, and the first extension portions F-C are arranged in the second direction DR2. Each of the second extension portions F-L extends in the second direction DR2, and is disposed between adjacent first extension portions F-C. The first extension portions F-C and the second extension portions F-L may define a grid shape. The first extension portions F-C may be positioned in a way such that the plurality of openings OP may be disposed in a zig-zag shape along the second direction DR2.

As illustrated in FIG. 5D, the plurality of openings OP may each have a uniform width. The width of each of the plurality of openings OP is not changed in the third direction DR3, and may have a uniform value.

Referring to FIG. 5E, in an alternative embodiment, the second extension portions F-L may be omitted. In such an embodiment, each of the first extension portions F-C may correspond to a stick member extending in the first direction DR1. In such an embodiment, stick members may be arranged between the first support portion PLT-1 and the second support portion PLT-2 along the second direction DR2 at uniform intervals.

With reference to FIG. 5B, the length of the stick members in the first direction DR1 may be the same as the length of the first support portion PLT-1 or the second support portion PLT-2. Regions between the stick members may correspond to the above-described openings OP.

Referring back to FIG. 5A, the cover layer SCV and the digitizer DTM are disposed on a lower side of the support plate PLT. The cover layer SCV is disposed to overlap the folding region FA0. The digitizer DTM may include a first digitizer DTM-1 and a second digitizer DTM-2 which respectively overlap the first support portion PLT-1 and the second support portion PLT-2. A portion of each of the first digitizer DTM-1 and the second digitizer DTM-2 may be disposed on (or to overlap) a lower side of the cover layer SCV.

The seventh adhesive layer AL7 couples the support plate PLT and the digitizer DTM to each other, and the eighth adhesive layer AL8 couples the cover layer SCV and support plate PLT to each other. The seventh adhesive layer AL7 may include a first portion A17-1, which couples the first support portion PLT-1 and the first digitizer DTM-1 to each other, and a second portion AL7-2, which couples the second support portion PLT-2 and the second digitizer DTM-2 to each other.

The cover layer SCV may be disposed between the first portion AL7-1 and the second portion AL7-2 of the seventh adhesive layer AL7 in the second direction DR2. The cover layer SCV may be spaced apart from the digitizer DTM to prevent interference with respect to the digitizer DTM in an unfolded state. The sum of the thickness of the cover layer SCV and the thickness of the eighth adhesive layer AL8 may be less than the thickness of the seventh adhesive layer AL7.

The cover layer SCV may cover the openings OP of the folding portion PLT-F. The cover layer SCV may have a lower elastic modulus than the support plate PLT. In an embodiment, for example, the cover layer SCV may include at least one selected from thermoplastic polyurethane, rubber, and silicon, but the embodiment of the invention is not limited thereto.

The digitizer DTM is also referred to as an electromagnetic radiation (EMR) sensing panel, and includes a plurality of loop coils which generate a magnetic field of a preset resonant frequency with an electronic pen. The magnetic field formed in the loop coil is applied to an LC resonance circuit including an inductor (coil) and a capacitor of the electronic pen. The coil generates a current by the received magnetic field, and transfers the generated current to the capacitor. Accordingly, the capacitor charges the current input from the coil and discharges the charged current to the coil. As a result, a magnetic field of the resonant frequency is emitted to the coil. The magnetic field emitted by the electronic pen may be absorbed again by the loop coil of the digitizer DTM, and accordingly, it is possible to determine to which position the electronic pen is in proximity in a touch screen.

The first digitizer DTM-1 and the second digitizer DTM-2 are disposed spaced apart with the predetermined gap GP interposed therebetween. The gap GP may be in a range of approximately 0.3 millimeter (mm) to approximately 3 mm, and may be disposed to correspond to the folding region FA0.

Figure 6A:
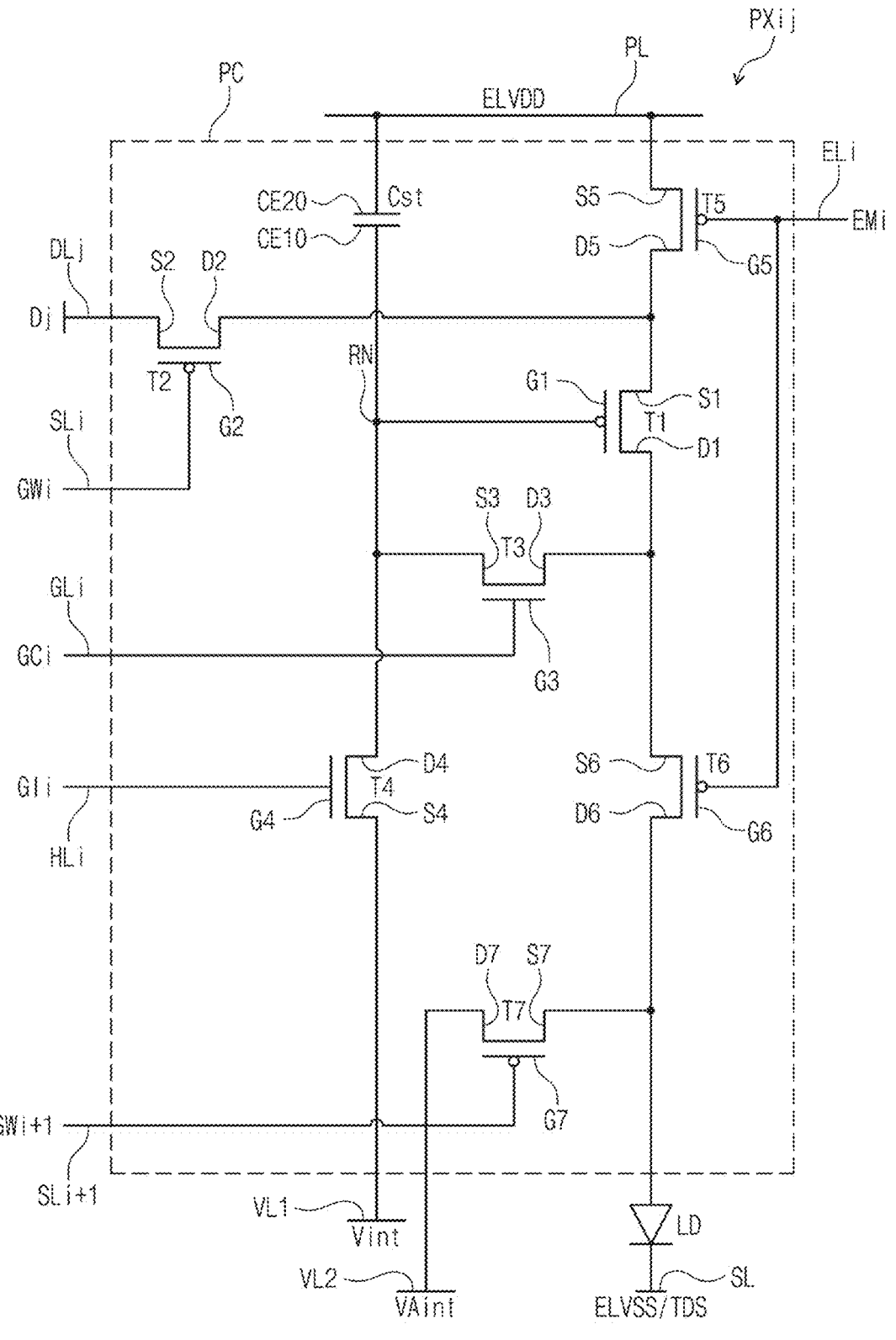
FIG. 6A is an equivalent circuit diagram of a pixel according to an embodiment of the invention.
Figure 6B:
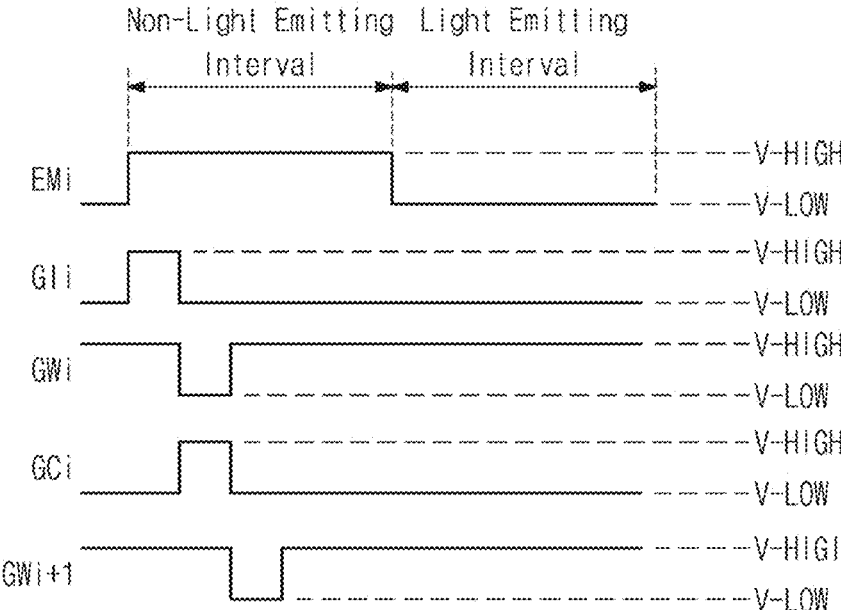
FIG. 6B is a signal timing diagram illustrating a driving method of a pixel according to an embodiment of the invention.

FIG. 6A is an equivalent circuit diagram of a pixel according to an embodiment of the invention. FIG. 6B is a signal timing diagram illustrating a driving method of a pixel according to an embodiment of the invention.

FIG. 6A exemplarily illustrates a pixel PXij connected to an i-th scan line SLi of a first group, and connected to a j-th data line DLj. The pixel PXij may include the pixel driving circuit PC (hereinafter, a pixel circuit) and a light emitting element LD.

In an embodiment, the pixel circuit PC may include first to seventh transistors T1 to T7 and a capacitor Cst. In such an embodiment, as shown in FIG. 6A, the first transistor T1, the second transistor T2, and the fifth transistor T5 to the seventh transistor T7 may be P-type transistors, and the third transistor T3 and the fourth transistor T4 may be N-type transistors. However, the embodiment of the invention is not limited thereto. Alternatively, the first to seventh transistors T1 to T7 may be implemented as either P-type transistors or N-type transistors. Herein, an input region (or input electrode) of an N-type transistor is described as a drain (or drain region), and an input region of a P-type transistor is described as a source (or source region), an output region (or output electrode) of the N-type transistor is described as the source (or source region), and an output region of the P-type transistor is described as the drain (or drain region). Also, in an embodiment of the invention, at least one selected from the first to seventh transistors T1 to T7 may be omitted.

In an embodiment, the first transistor T1 may be a driving transistor, and the second transistor T2 may be a switching transistor. The capacitor Cst is electrically connected between the power line PL that receives a first power voltage ELVDD and a reference node RN. The capacitor Cst includes a first electrode CE10 electrically connected to the reference node RN, and a second electrode CE20 electrically connected to the power line PL.

The light emitting element LD is electrically connected between the first transistor T1 and a signal line SL. The signal line SL may provide a second power voltage ELVSS, or provide a driving signal TDS to a cathode of the light emitting element LD. The second power voltage ELVSS has a lower level than the first power voltage ELVDD.

The first transistor T1 is electrically connected between the power line PL and an anode of the light emitting element LD. A source S1 of the first transistor T1 is electrically connected to the power line PL. In the disclosure, "being electrically connected between a transistor and a signal line or between a transistor and a transistor" means that "a source, a drain, and a gate of the transistor have a shape of a single body with the signal line, or are connected through a connection electrode." Between the source S1 of the first transistor T1 and the power line PL, another transistor may be provided or may be not provided.

A drain D1 of the first transistor T1 is electrically connected to the anode of the light emitting element LD. Between the drain D1 of the first transistor T1 and the anode of the light emitting element LD, another transistor may be provided or may not be provided. A gate G1 of the first transistor T1 is electrically connected to the reference node RN.

The second transistor T2 is electrically connected between the j-th data line DLj and the source S1 of the first transistor T1. A source S2 of the second transistor T2 is electrically connected to the j-th data line DLj, and a drain D2 of the second transistor T2 is electrically connected to the source S1 of the first transistor T1. In the embodiment, a gate G2 of the second transistor T2 may be electrically connected to the i-th scan line SLi of the first group.

The third transistor T3 is electrically connected between the reference node RN and the drain D1 of the first transistor T1. A drain D3 of the third transistor T3 is electrically connected to the drain D1 of the first transistor T1, and a source S3 of the third transistor T3 is electrically connected to the reference node RN. Although the third transistor T3 having a single gate structure is illustrated in FIG. 6A, the third transistor T3 may include a plurality of gates. In an embodiment, a gate G3 of the third transistor T3 may be electrically connected to an i-th scan line GLi of a second group. The fourth transistor T4 is electrically connected between the reference node RN and a first voltage line VL1. A drain D4 of the fourth transistor T4 is electrically connected to the reference node RN, and a source S4 of the fourth transistor T4 is electrically connected to the first voltage line VL1. Although the fourth transistor T4 having a single gate structure is illustrated in FIG. 6A, the fourth transistor T4 may include a plurality of gates. In an embodiment, a gate G4 of the fourth transistor T4 may be electrically connected to an i-th scan line HLi of a third group.

The fifth transistor T5 is electrically connected between the power line PL and the source S1 of the first transistor T1. A source S5 of the fifth transistor T5 is electrically connected to the power line PL, and a drain D5 of the fifth transistor T5 is electrically connected to the source S1 of the first transistor T1. A gate G5 of the fifth transistor T5 may be electrically connected to an i-th light emission line ELi.

The sixth transistor T6 is electrically connected between the drain D1 of the first transistor T1 and the light emitting element LD. A source S6 of the sixth transistor T6 is electrically connected to the drain D1 of the first transistor T1, and a drain D6 of the sixth transistor T6 is electrically connected to the anode of the light emitting element LD. A gate G6 of the sixth transistor T6 may be electrically connected to the i-th light emission line ELi. In an embodiment of the invention, the gate G6 of the sixth transistor T6 may be connected to a different signal from the signal line to which the gate G5 of the fifth transistor T5 is connected.

The seventh transistor T7 is electrically connected between the drain D6 of the sixth transistor T6 and a second voltage line VL2. A source S7 of the seventh transistor T7 is electrically connected to the drain D6 of the sixth transistor T6, and a drain D7 of the seventh transistor T7 is electrically connected to the second voltage line VL2. A gate G7 of the seventh transistor T7 may be electrically connected to an (i+1)-th scan line SLi+1 of the first group.

Referring to FIG. 6B, the operation of the pixel PXij will be described in more detail. Referring to FIG. 6B, each of signals Ei, Gli, GWi, GCi, and GWi+1 may have a high level V-HIGH during some intervals and may have a low level V-LOW during some intervals. In FIG. 6B, the signals Ei, Gli, GWi, GCi, and GWi+1 are illustrated as having a same pulse width as each other, but the embodiment of the invention is not limited thereto. The pulse width of the signals Ei, Gli, GWi, GCi, and GWi+1 may be determined in consideration of a desired turn-on interval of the first to seventh transistors T1 to T7. N-type transistors are turned on when a corresponding signal has the high level V-HIGH, and P-type transistors are turned on when a corresponding signal has the low level V-LOW.

When a light emission control signal EMi has the high level V-HIGH, the fifth transistor T5 and the sixth transistor T6 are turned off. When the fifth transistor T5 and the sixth transistor T6 are turned off, a current path is not formed between the power line PL and the light emitting element LD. Therefore, a corresponding interval during which the light emission control signal EMi has the high level V-HIGH may be defined as a non-light emitting interval.

When a scan signal Gli applied to the i-th scan line HLi of the third group has the high level V-HIGH, the fourth transistor T4 is turned on. When the fourth transistor T4 is turned on, the reference node RN is initialized by a first initialization voltage Vint.

When a scan signal GWi applied to the i-th scan line SLi of the first group has the low level V-LOW, and a scan signal GCi applied to the i-th scan line GLi of the second group has the high level V-HIGH, the second transistor T2 and the third transistor T3 are turned on.

Accordingly, the reference node RN is initialized by the initialization voltage Vint, and the first transistor T1 is in the state of being turned on. When the first transistor T1 is turned on, a voltage corresponding to a data signal Dj (see FIG. 6A) is provided to the reference node RN. At this time, the capacitor Cst stores the voltage corresponding to the data signal Dj. The voltage corresponding to the data signal Dj may be a voltage reduced by a threshold voltage Vth of the first transistor T1 from the data signal Dj.

When a scan signal GWPi+1 applied to the (i+1)-th scan line SLi+1 of the first group has the low level V-LOW, the seventh transistor T7 is turned on. As the seventh transistor T7 is turned on, the anode of the light emitting element LD is initialized by a second initialization voltage VAint. A parasitic capacitor of the light emitting element LD may be discharged.

When the light emission control signal EMi has the low level V-LOW, the fifth transistor T5 and the sixth transistor T6 are turned on. When the fifth transistor T5 is turned on, the first power voltage ELVDD is provided to the first transistor T1. When the sixth transistor T6 is turned on, the first transistor T1 and the light emitting element LD are electrically connected to each other. The light emitting element LD generates light of luminance in correspondence to the amount of a current provided thereto.

Figure 7A:
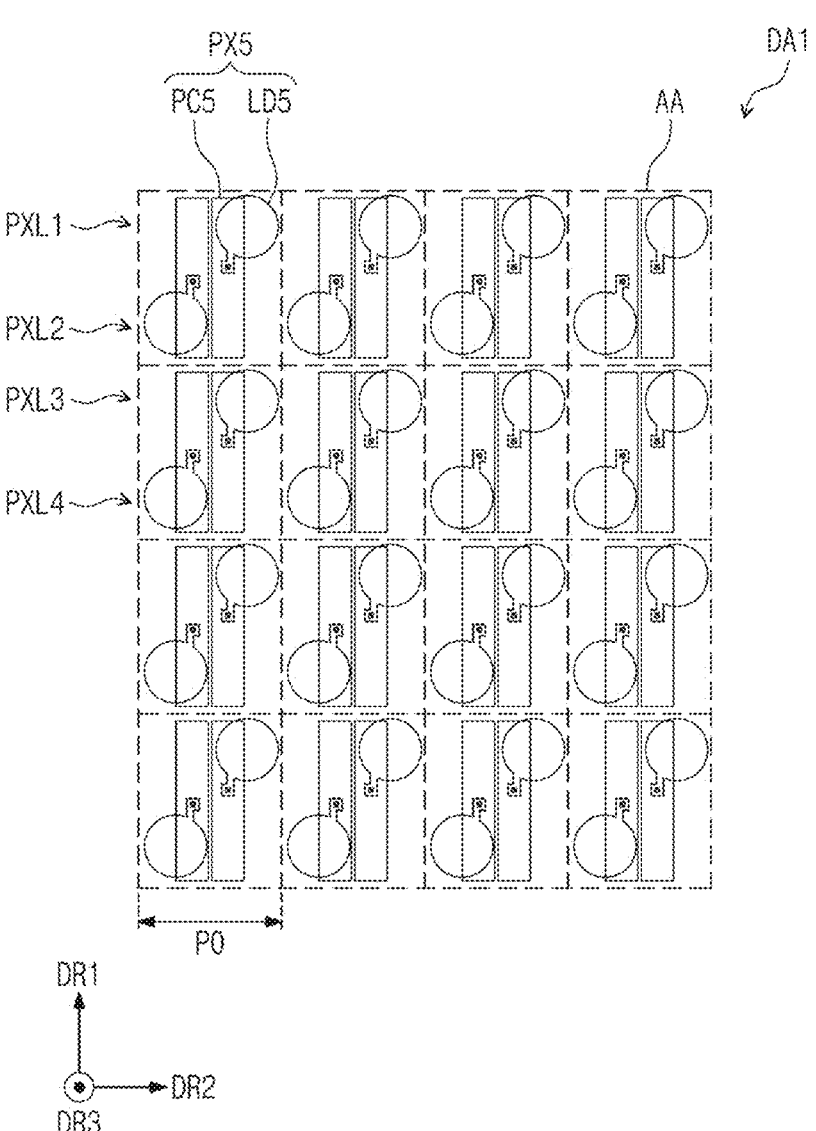
FIG. 7A is an enlarged plan view of a portion of a first display region according to an embodiment of the invention.
Figure 7B:
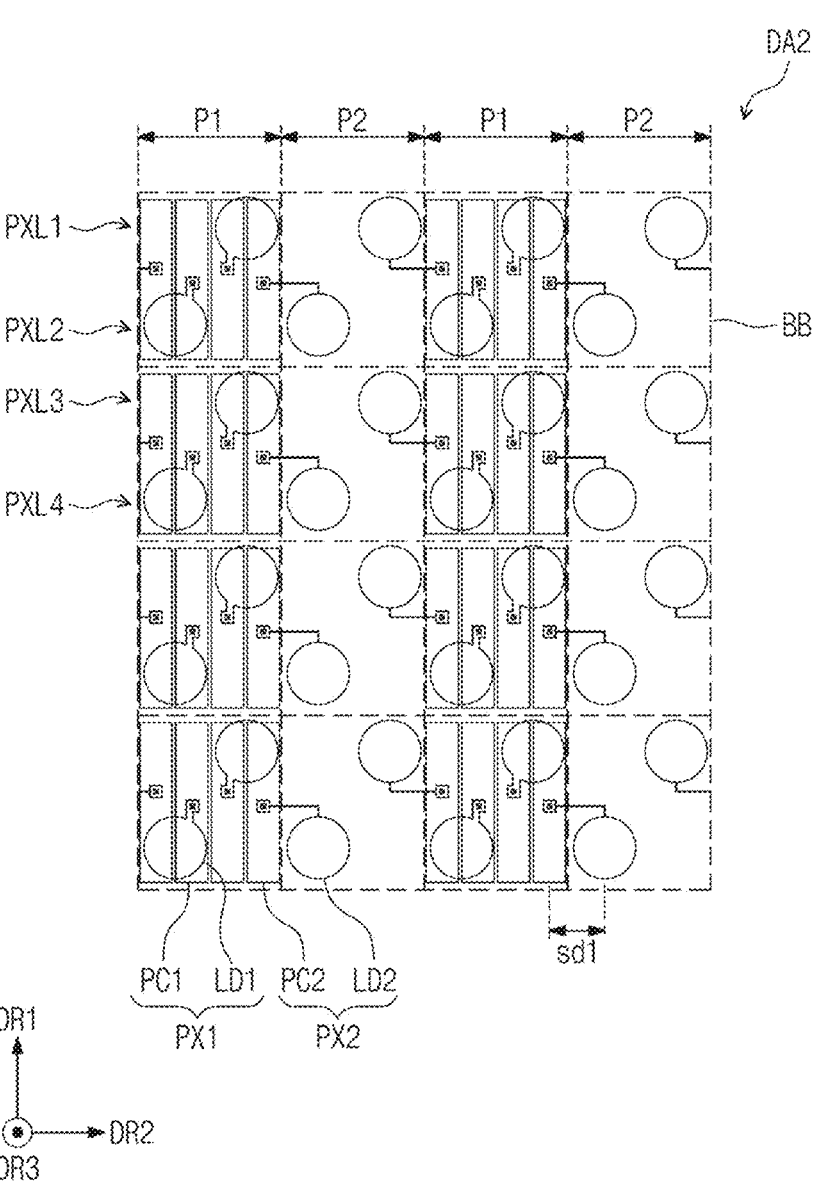
FIG. 7B is an enlarged plan view of a portion of a second display region according to an embodiment of the invention.
Figure 7C:
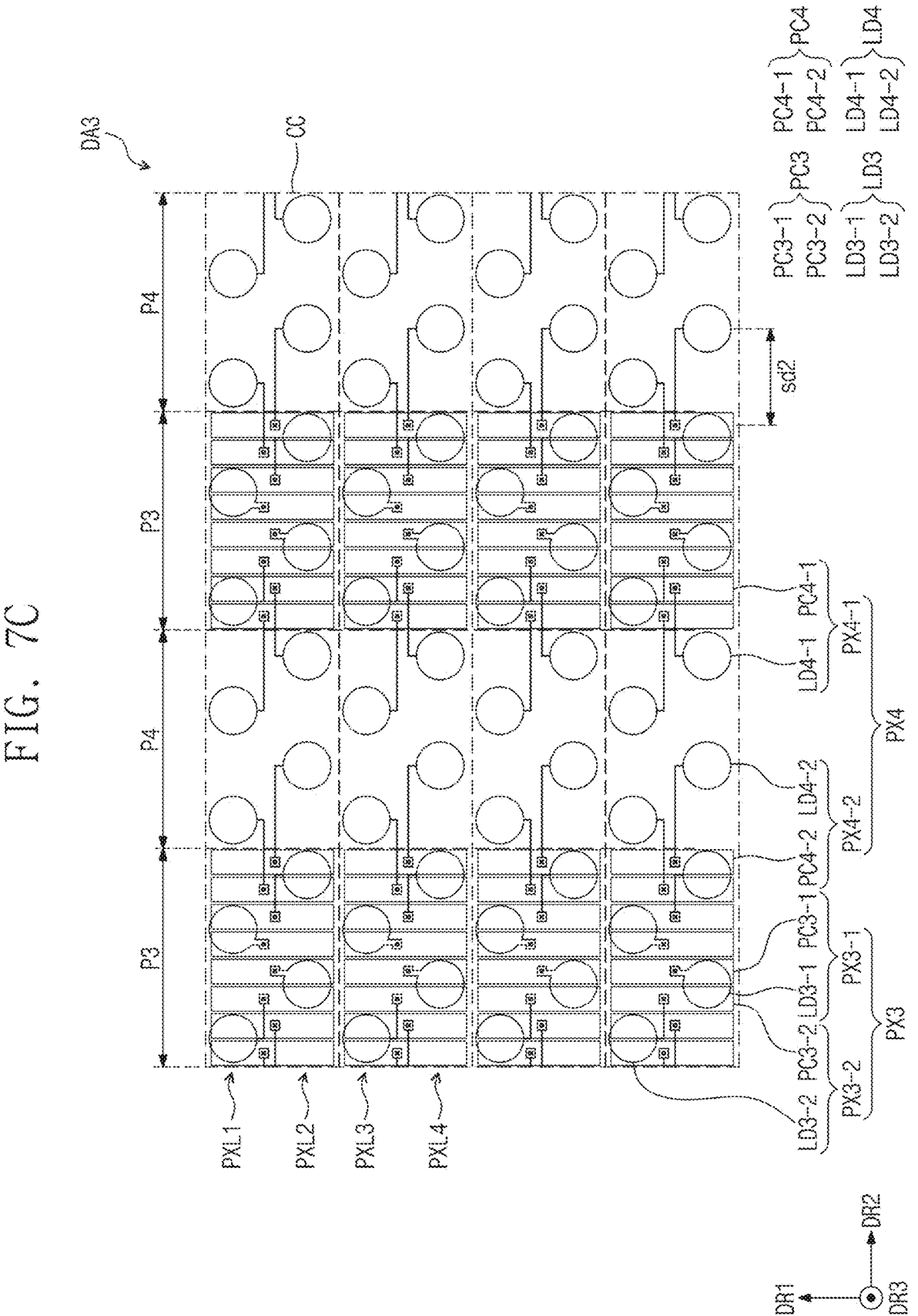
FIG. 7C is an enlarged plan view of a portion of a third display region according to an embodiment of the invention.
Figure 7D:
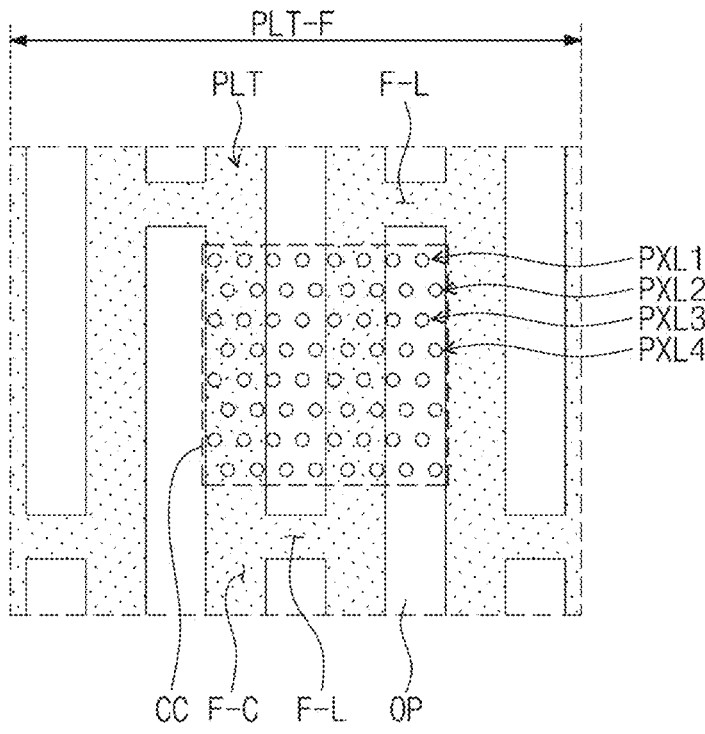
FIG. 7D is a plan view illustrating a third display region according to an embodiment of the invention overlapping a support plate.

FIG. 7A is an enlarged plan view of portion AA of the first display region DA1 according to an embodiment of the invention. FIG. 7B is an enlarged plan view of portion BB of the second display region DA2 according to an embodiment of the invention. FIG. 7C is an enlarged plan view of portion CC of the third display region DA3 according to an embodiment of the invention. FIG. 7D is a plan view illustrating the third display region DA3 according to an embodiment of the invention overlapping the support plate PLT.

The resolution of a display device is determined by the number of pixels disposed in a reference region (or a unit area), and may be measured, for example, in pixels per inch (PPI). Typically, the resolution of a light emitting element and the resolution of a pixel circuit are the same as the resolution of a pixel. This is because each pixel includes a light emitting element and a pixel circuit connected to the light emitting element in a 1-to-1 manner, and the light emitting element and the pixel circuit are uniformly disposed throughout the display region DP-DA (see FIG. 3). However, in the display device according to an embodiment of the invention, the arrangement of pixel circuits is not uniform in some regions, and may be divided into a portion having a high arrangement density and a portion having a low arrangement density in some regions. Hereinafter, the arrangement of the pixel circuits will be described in greater detail.

Referring to FIG. 7A to FIG. 7C, the first display region DA1, the second display region DA2, and the third display region DA3 may each have a different pixel arrangement from each other. More specifically, the first display region DA1, the second display region DA2, and the third display region DA3 may each have a same arrangement of light emitting elements as each other, and the first display region DA1, the second display region DA2, and the third display region DA3 may each have a different arrangement of pixel circuits from each other. Having the same arrangement of light emitting elements may mean that gaps between the light emitting elements are the same. In addition, it may mean that color arrangements of the light emitting elements are the same. Hereinafter, with reference to FIG. 7A to FIG. 7C, an embodiment of the invention will be described in greater detail.

Referring to FIG. 7A, in the first display region DA1, fifth pixels PX5 are provided. In the first display region DA1, the fifth pixels PX5 are uniformly disposed. Each of the fifth pixels PX5 includes a light emitting element LD5 (hereinafter, a fifth light emitting element) and a pixel circuit PC5 (hereinafter, a fifth pixel circuit) electrically connected thereto. The fifth light emitting elements LD5 may include a red light emitting element, a green light emitting element, and a blue light emitting element. The red light emitting element, the green light emitting element, and the blue light emitting element having the same area are exemplarily illustrated, but the embodiment of the invention is not limited thereto. In addition, in FIG. 7A, an anode is illustrated as a representative of the red light emitting element, the green light emitting element, and the blue light emitting element. The fifth pixel circuit PC5 corresponding to the anode may be connected thereto through a contact-hole. A detailed description thereof will be followed. The anode in a circular shape is exemplarily illustrated, but the shape of the anode is not particularly limited. In an embodiment, the first display region DA1 may be a region overlapping the first region PLA1 of the support plate PLT illustrated in FIG. 5B.

Referring to FIG. 7A, two fifth pixel circuits PC5 are disposed adjacent to each other and form one pixel circuit. A plurality of pixel groups are disposed spaced apart from each other at regular intervals. However, the arrangement of the fifth pixel circuits PC5 illustrated in FIG. 7A is just an example, and the embodiment of the invention is not limited thereto. The fifth pixel circuits PC5 may be disposed spaced apart from each other at uniform intervals within pixel rows PXL1, PXL2, PXL3, and PXL4.

The fifth pixel circuit PC5 may have an equivalent circuit structure illustrated in FIG. 6A. A region illustrated as the fifth pixel circuit PC5 in FIG. 6A is a schematically illustrated region which is occupied by the first to seventh transistors T1 to T7 and the capacitor Cst illustrated in FIG. 6A. The fifth pixel circuits PC5 are all illustrated the same, but the embodiment of the invention is not limited thereto. The fifth pixel circuit PC5 may include a first-type pixel circuit and a second-type pixel circuit, which may be paired and repeatedly disposed.

A plurality of pixel rows PXL1, PXL2, PXL3, and PXL4 may be defined in the first display region DAL In each of a first pixel row PXL1 and a second pixel row PXL2, green light emitting elements are arranged along the second direction DR2, and in a second pixel row PXL2, red light emitting elements and blue light emitting elements may be alternately arranged along the second direction DR2. In a fourth pixel row PXL4, blue light emitting elements and red light emitting elements may be alternately arranged along the second direction DR2.

Although not separately illustrated, the first pixel row PXL1 and the second pixel row PXL2 may include light emitting elements of a same arrangement as each other, that is, an arrangement of the light emitting elements in the first pixel row PXL1 is the same as an arrangement of the light emitting elements in the second pixel row PXL2. Each of the first pixel row PXL1 and the second pixel row PXL2 may include a plurality of pixel units arranged in the second direction DR2. Each of the pixel units may include a red light emitting element, a green light emitting element, and a blue light emitting element arranged along the second direction DR2. Each of the pixel units may further include a fourth color light emitting element which generates light of a different color from the red light emitting element, the green light emitting element, and the blue light emitting element.

Referring to FIG. 7B, the second display region DA2 includes a first partial region P1 and a second partial region P2. The first partial regions P1 and the second partial regions P2 may be alternately arranged along the second direction DR2. The second display region DA2 may be a region overlapping the second region PLA2 of the support plate PLT illustrated in FIG. 5B. Each of the first partial region P1 and the second partial region P2 included in the second display region DA2 may overlap the second region PLA2. That is, each of the first partial region P1 and the second partial region P2 included in the second display region DA2 may overlap a flat surface defined by each of the first support portion PLT-1 and the second support portion PLT-2 of the support plate PLT illustrated in FIG. 5B.

Referring to FIG. 7B, first pixels PX1 and second pixels PX2 are disposed in the second display region DA2. Each of the first pixels PX1 includes a light emitting element LD1 (hereinafter, a first light emitting element) and a pixel circuit PC1 (hereinafter, a first pixel circuit) electrically connected thereto. Each of the second pixels PX2 includes a light emitting element LD2 (hereinafter, a second light emitting element) and a pixel circuit PC2 (hereinafter, a second pixel circuit) electrically connected thereto.

The first pixel circuits PC1 and the second pixel circuits PC2 are arranged according to a different rule from the fifth pixel circuits PC5. The arrangement of the pixel circuits PC5 of the first display region DA1 and the arrangement of the pixel circuits PC1 and PC2 of the second display region DA2 may be different from each other. In such an embodiment, the resolution (or the pixel circuit density) of the pixel circuits PC5 of the first display region DA1 may be different from the resolution of pixel circuits of the first partial region P1, the resolution of the pixel circuits PC5 of the first display region DA1 may be different from the resolution of pixel circuits of the second partial region P2, and the resolution of the pixel circuits of the first partial region P1 may be different from the resolution of the pixel circuits of the second partial region P2.

As illustrated in FIG. 7B, the first pixel circuits PC1 and the second pixel circuits PC2 may all be disposed in the first partial region P1. The first light emitting element LD1 may overlap the first pixel circuit PC1, whereas the second light emitting element LD2 may not overlap the second pixel circuit PC2. In the second partial region P2, a pixel circuit may not be disposed.

Referring to FIG. 7A and FIG. 7B, the resolution of a pixel of the first display region DA1 and the resolution of a pixel of the second display region DA2 are the same as each other, and the resolution of a light emitting element of the first display region DA1 and the resolution of a light emitting element of the second display region DA2 are the same as each other. The resolution of the pixel circuits of the first partial region P1 is higher than the resolution of the pixel circuits of a corresponding region in the first display region DA1. That is, pixel circuits are more densely disposed in the first partial region P1 than in the first display region DA1. More specifically, the number of pixel circuits disposed per reference area in the first partial region P1 may be greater than the number of pixel circuits disposed per reference area in the first display region DA1. In FIG. 7A to FIG. 7C, a reference area may be, for example, an area in a rectangular shape including two adjacent light emitting elements along the second direction DR2. In an embodiment, as illustrated in FIG. 7A and FIG. 7B, two light emitting elements and two pixel circuits may be disposed per reference area in the first display region DA1, two light emitting elements and four pixel circuits may be disposed per reference area in the first partial region P1, and two light emitting elements may be disposed but no pixel circuit may be disposed in the second partial region P2.

When the density of pixel circuits of the first display region DA1 is defined as a first pixel density, and the density of pixel circuits of the first partial region P1 is defined as a second pixel density, the first pixel density may be less than the second pixel density. In the disclosure, the "density of pixel circuits or light emitting elements" may be defined through the number of pixel circuits or light emitting elements disposed per reference area. In an embodiment, since no pixel circuit is disposed in the second partial region P2, a third pixel density, which is the density of pixel circuits of the second partial region P2, may be less than the first pixel density and the second pixel density.

The resolution of the pixel circuits PC1 and PC2 of the first partial region P1 may be higher than the resolution of the pixel circuits PC5 of the first display region DA1. However, an area occupied by one fifth pixel circuit PC5, an area occupied by one first pixel circuit PC1, and an area occupied by one second pixel circuit PC2 may be substantially the same as each other. When pixel circuits have a same area as each other, it means that the pixel circuits have a same layout structure, and it means that transistors constituting a pixel circuit have a same size as each other and are arranged in a same arrangement rule as each other. In the disclosure, "substantially the same" means not only that numerical values such as an area are physically the same, but also means that the numerical values are in the same range considering differences within an error range that may occur in a process despite the same design. In an embodiment, since the fifth pixel circuit PC5, the first pixel circuit PC1, and the second pixel circuit PC2 have a same area as each other, it is possible to design a uniform circuit. Since noise factors, such as a peripheral signal and parasitic capacitance, which affect the operation of the fifth pixel circuit PC5, the first pixel circuit PC1, and the second pixel circuit PC2 may be the same as each other, the control of a pixel circuit may be easy.

Referring to FIG. 7C, the third display region DA3 includes a third partial region P3 and a fourth partial region P4. The third partial regions P3 and the fourth partial regions P4 may be alternately arranged along the second direction DR2. The third display region DA3 may be a region overlapping the third region PLA3 of the support plate PLT illustrated in FIG. 5B. Herein, the third partial region P3 may be a region overlapping the first extension portion F-C of FIG. 5C, and the fourth partial region P4 may be a region overlapping the opening OP of FIG. 5C. In FIG. 7D, light emitting elements LD3 and LD4 of the pixel rows PXL1, PXL2, PXL3, and PXL4 of FIG. 7C overlapping the support plate PLT are illustrated. FIG. 7D exemplarily illustrates an embodiment where the light emitting elements LD3 and LD4 are disposed only in some regions marked as CC, but third pixels PX3 and fourth pixels PX4 may be disposed in other region according to a rule to be described later. The fourth partial region P4 overlapping the opening OP of FIG. 5C has low impact resistance, so that a circuit may be disconnected or short-circuited by an external impact. Referring to FIG. 7C, a pixel circuit disposed in the fourth partial region P4 may be minimized to reduce defects of the pixel circuit.

In an embodiment, the third pixels PX3 and the fourth pixels PX4 are disposed in the third display region DA3. Each of the third pixels PX3 includes a light emitting element LD3 (hereinafter, a third light emitting element) and a pixel circuit PC3 (hereinafter, a third pixel circuit) electrically connected thereto. Each of the fourth pixels PX4 includes a light emitting element LD4 (hereinafter, a fourth light emitting element) and a pixel circuit PC4 (hereinafter, a fourth pixel circuit) electrically connected thereto.

Each of the third pixels PX3 may include first third pixels PX3-1 and second third pixels PX3-2. Each of the first third pixels PX3-1 may include a first third light emitting element LD3-1 and a first third pixel circuit PC3-1 electrically connected thereto. Each of the second third pixels PX3-2 may include a second third light emitting element LD3-2 and a second third pixel circuit PC3-2 electrically connected thereto. The first third pixel circuit PC3-1 may be disposed in a central portion of the third partial region P3, and the second third pixel circuit PC3-2 may be disposed spaced apart from the center of the third partial region P3 compared to the first third pixel circuit PC3-1. The first third light emitting element LD3-1 may be disposed in a central portion of the third partial region P3, and the second third light emitting element LD3-2 may be disposed at the outer periphery of the third partial region P3.

Each of the fourth pixels PX4 may include first fourth pixels PX4-1 and second fourth pixels PX4-2. Each of the first fourth pixels PX4-1 may include a first fourth light emitting element LD4-1 and a first fourth pixel circuit PC4-1 electrically connected thereto. Each of the second fourth pixels PX4-2 may include a second fourth light emitting element LD4-2 and a second fourth pixel circuit PC4-2 electrically connected thereto. The first fourth pixel circuit PC4-1 may be disposed adjacent to the second third pixel circuit PC3-2, and the second fourth pixel circuit PC4-2 may be disposed at the outermost periphery of the third partial region P3. The first fourth light emitting element LD4-1 may be disposed at the outer periphery of the fourth partial region P4, and the second fourth light emitting element LD4-2 may be disposed in a central portion of the fourth partial region P4.

The third pixel circuits PC3 and the fourth pixel circuits PC4 are arranged according to a different rule from the fifth pixel circuits PC5. The arrangement of the pixel circuits PC5 of the first display region DA1 and the arrangement of the pixel circuits PC3 and PC4 of the third display region DA3 may be different from each other. In an embodiment, the resolution (or the pixel circuit density) of the pixel circuits PC5 of the first display region DA1 may be different from the resolution of pixel circuits of the third partial region P3, the resolution of the pixel circuits PC5 of the first display region DA1 may be different from the resolution of pixel circuits of the fourth partial region P4, and the resolution of the pixel circuits of the third partial region P3 may be different from the resolution of the pixel circuits of the fourth partial region P4.

As illustrated in FIG. 7C, the third pixel circuits PC3 and the fourth pixel circuits PC4 may all be disposed in the third partial region P3. The third light emitting element LD3 may overlap the third pixel circuit PC3 and the fourth pixel circuit PC4, whereas the fourth light emitting element LD4 may not overlap pixel circuits. In the fourth partial region P4, a pixel circuit may not be disposed.

Referring to FIG. 7A and FIG. 7C, the resolution of a pixel of the first display region DA1 and the resolution of a pixel of the third display region DA3 are the same as each other, and the resolution of a light emitting element of the first display region DA1 and the resolution of a light emitting element of the third display region DA3 are the same as each other. The resolution of the pixel circuits of the third partial region P3 is higher than the resolution of the pixel circuits of the first display region DA1. That is, pixel circuits are more densely disposed in the third partial region P3 than in the first display region DA1. In such an embodiment, the number of pixel circuits disposed per reference area in the third partial region P3 may be greater than the number of pixel circuits disposed per reference area in the first display region DA1. In FIG. 7A to FIG. 7C, a reference area may be, for example, an area in a rectangular shape including two adjacent light emitting elements along the second direction DR2. In an embodiment, as illustrated in FIG. 7A and FIG. 7C, two light emitting elements and two pixel circuits may be disposed per reference area in the first display region DA1, two light emitting elements and four pixel circuits may be disposed per reference area in the third partial region P3, and two light emitting elements may be disposed but no pixel circuit may be disposed in the fourth partial region P4.

When the density of pixel circuits of the first display region DA1 is defined as a first pixel density, and the density of pixel circuits of the third partial region P3 is defined as a fourth pixel density, the first pixel density may be less than the fourth pixel density. In such an embodiment, since no pixel circuit is disposed in the fourth partial region P4, a fifth pixel density, which is the density of pixel circuits of the fourth partial region P4, may be less than the first pixel density and the fourth pixel density.

The resolution of the pixel circuits PC3 and PC4 of the third partial region P3 is higher than the resolution of the pixel circuits PC5 of the first display region DA1. In an embodiment, an area occupied by one fifth pixel circuit PC5, an area occupied by one third pixel circuit PC3, and an area occupied by one fourth pixel circuit PC4 may be substantially the same as each other. In an embodiment, areas respectively occupied by the first pixel circuit PC1 to the fifth pixel circuit PC5 may be substantially the same as each other. Since the first pixel circuit PC1 to the fifth pixel circuit PC5 each have a same area as each other, it is possible to design a uniform circuit. Since noise factors, such as a peripheral signal and parasitic capacitance, which affect the operation of the first pixel circuit PC1 to the fifth pixel circuit PC5 may be the same as each other, the control of a pixel circuit may be easy.

In an embodiment, the width of each of the third partial region P3 and the fourth partial region P4 in the second direction DR2 may be greater than the width of each of the first partial region P1 and the second partial region P2 in the second direction DR2. In an embodiment, the width of each of the third partial region P3 and the fourth partial region P4 in the second direction DR2 may be twice the width of each of the first partial region P1 and the second partial region P2 in the second direction DR2. In an embodiment the width of each of the third partial region P3 and the fourth partial region P4 in the second direction DR2 may be substantially the same as the sum of the widths of the first partial region P1 and the second partial region P2 in the second direction DR2.

In an embodiment, the resolution of a light emitting element in each of the first display region DA1, the second display region DA2, and the third display region DA3 may be the same as each other. That is, the number of light emitting elements disposed per reference area in each of the first display region DA1, the second display region DA2, and the third display region DA3 may be the same as each other. The density of light emitting elements in each of the first display region DA1, the second display region DA2, and the third display region DA3 may be the same.

In FIG. 7C, a portion in which the third display region DA3 overlaps the second extension portion F-L of FIG. 5C is not shown. In the third display region DA3, a region overlapping the second extension portion F-L of FIG. 5C may have a same pixel structure as the pixel structure of the third partial region P3, may have a same pixel structure as the pixel structure of the fourth partial region P4, or may have a same pixel structure as the pixel structure of the first display region DA1 illustrated in FIG. 7A, but the embodiment of the invention is not limited thereto. In an embodiment, for example, the region overlapping the second extension portion F-L may have the same structure as the structure of the third partial region P3, and the third pixel circuit PC3 and the third light emitting element LD3 which are disposed in the region overlapping the second extension portion F-L may be electrically connected. Alternatively, the region overlapping the second extension portion F-L may have a same structure as the structure of the fourth partial region P4, and the fourth light emitting element LD4 disposed in the region overlapping the second extension portion F-L may be electrically connected to the fourth pixel circuit PC4 disposed in the third partial region P3.

Referring to FIG. 7B and FIG. 7C, when a separation distance between the second pixel circuit PC2 disposed in the first partial region P1 and the second light emitting element LD2 disposed in the second partial region P2 is defined as a first separation distance sd1, and when a separation distance between the fourth pixel circuit PC4 disposed in the third partial region P3 and the fourth light emitting element LD4 disposed in the fourth partial region P4 is defined as a second separation distance sd2, the first separation distance sd1 may be less than the second separation distance sd2. In an embodiment, the second separation distance sd2 may be defined as a separation distance between the second fourth light emitting element LD4-2 and the second fourth pixel circuit PC4-2 in the second fourth pixel PX4-2 among the pixels included in the fourth pixel PX4. In an embodiment, although not shown in FIG. 7C, in the first fourth pixel PX4-1 among the pixels included in the fourth pixel PX4, a separation distance between the first fourth light emitting element LD4-1 and the first fourth pixel circuit PC4-1 may also be greater than the first separation distance sd1. In the disclosure, the "separation distance" such as the first separation distance sd1 and the second separation distance sd2 may be defined as a distance at which a central portion of a pixel circuit is spaced apart from a central portion of a light emitting element connected thereto along the second direction DR2.

Figure 8A:
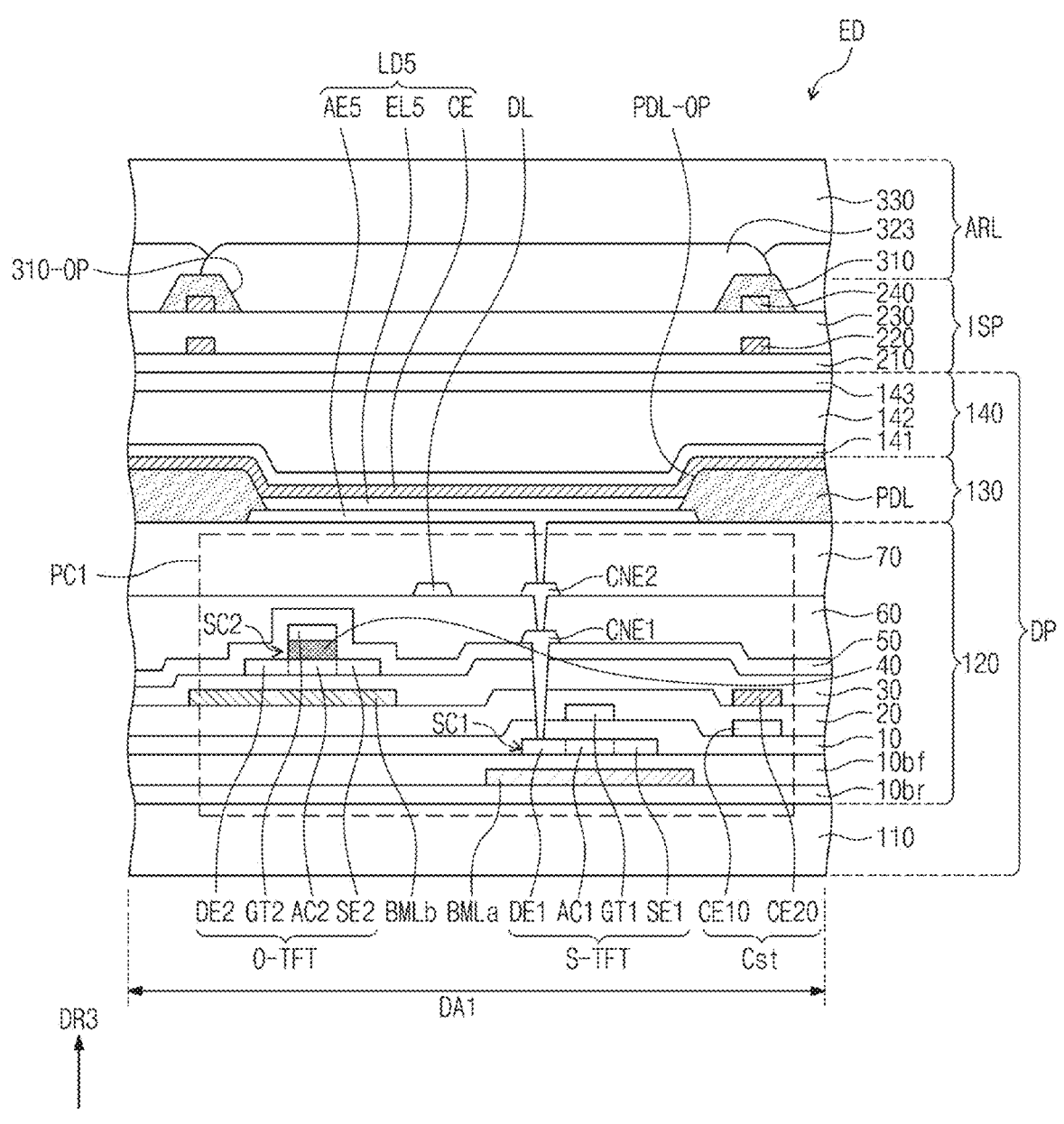
FIG. 8A is a cross-sectional view of a first display region according to an embodiment of the invention.

FIG. 8A is a cross-sectional view of the first display region DA1 according to an embodiment of the invention.

Figure 8B:
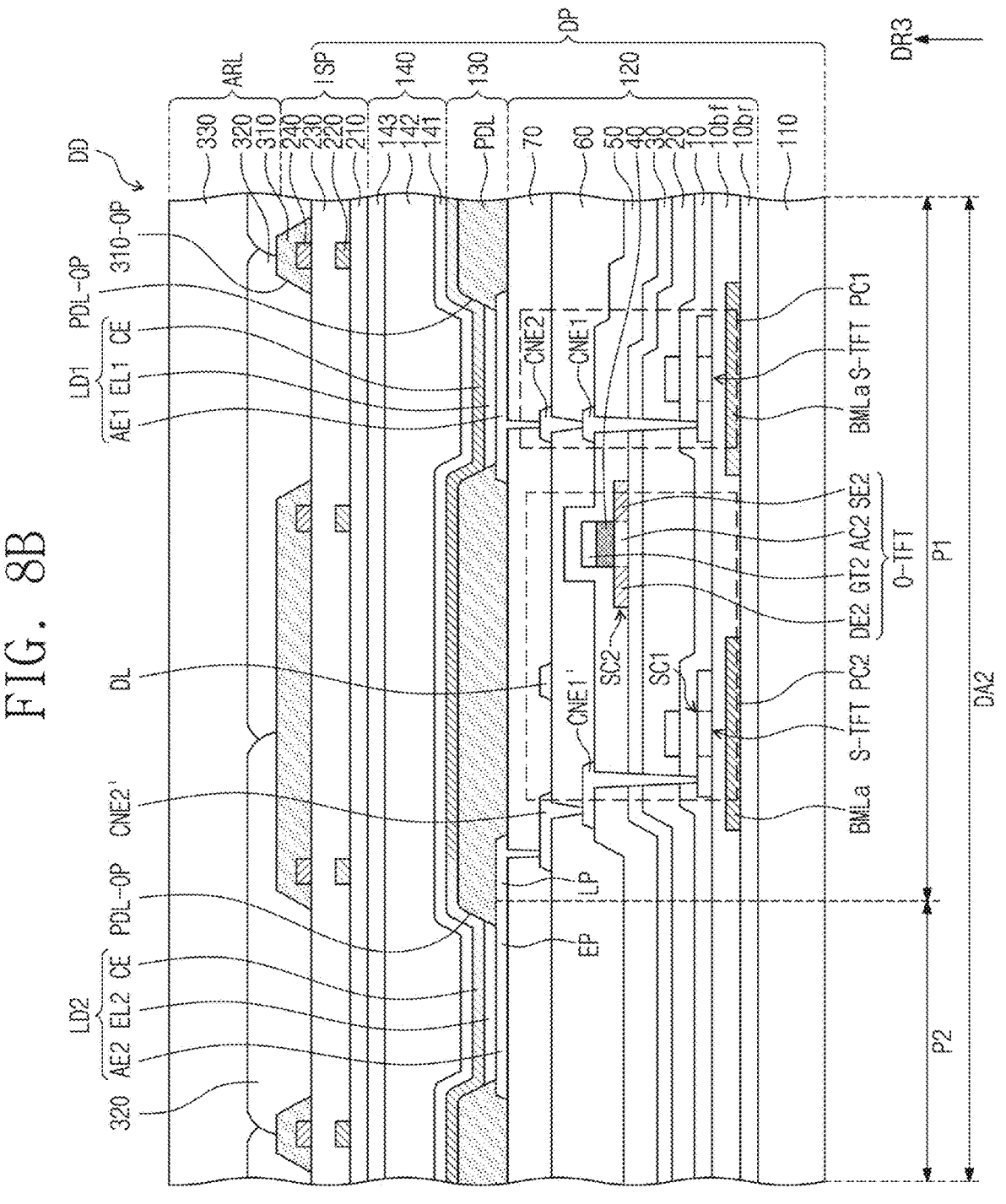
FIG. 8B and FIG. 8C are cross-sectional views of a second display region according to an embodiment of the invention.
Figure 8C:
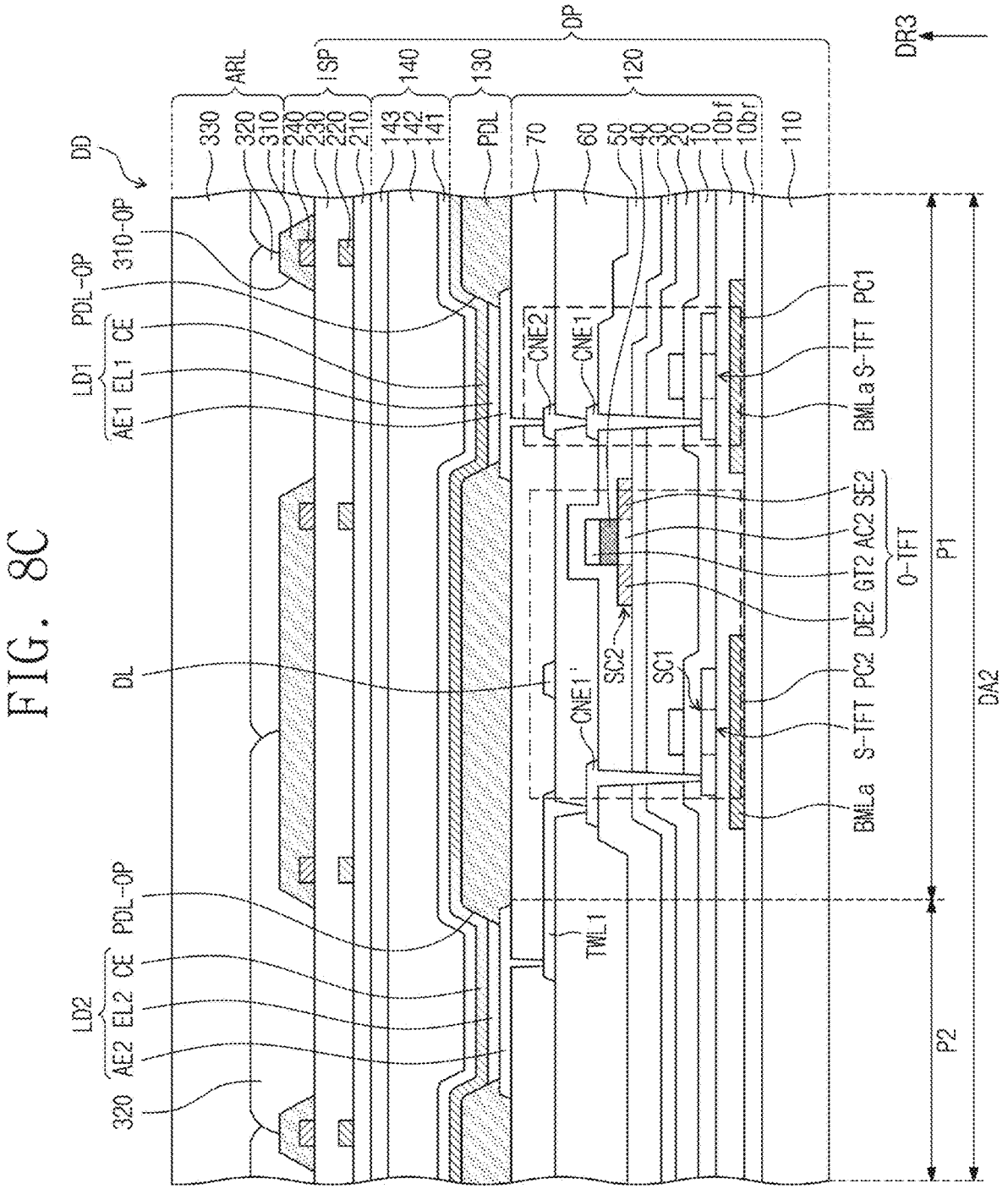
Figure 8D:
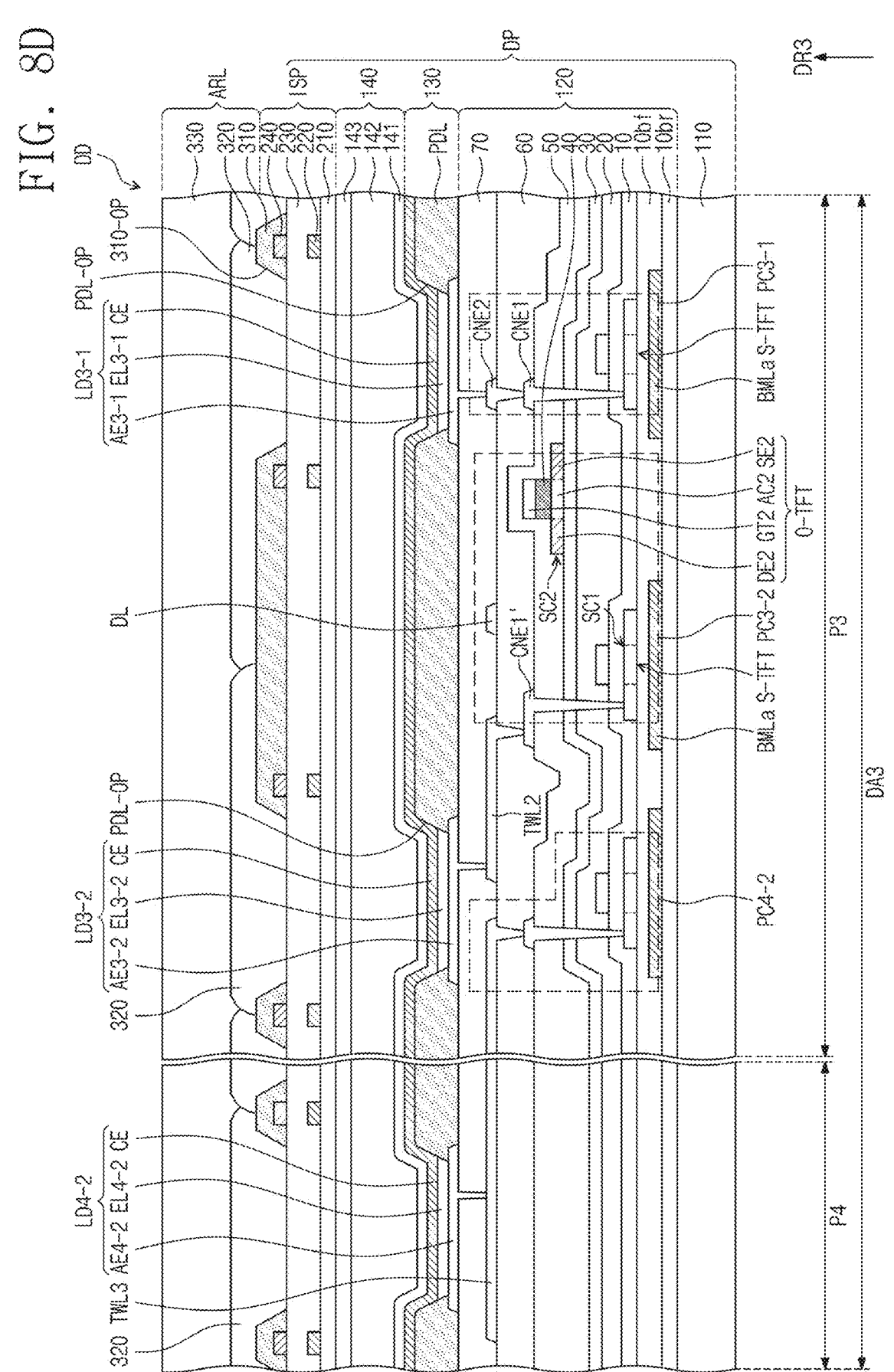
FIG. 8D is a cross-sectional view of a third display region according to an embodiment of the invention.

FIG. 8B and FIG. 8C are cross-sectional views of the second display region DA2 according to an embodiment of the invention. FIG. 8D is a cross-sectional view of the third display region DA3 according to an embodiment of the invention.

In FIG. 8A, the fifth light emitting element LD5 described with reference to FIG. 7A and a silicon transistor S-TFT and an oxide transistor O-TFT of the fifth pixel circuit PC5 are illustrated. In the equivalent circuit illustrated in FIG. 6A, the third and fourth transistors T3 and T4 may be oxide transistors O-TFT, and the rest of the transistors may be silicon transistors S-TFT. In FIG. 8B and FIG. 8C, a portion of the first light emitting element LD1 and a portion the first pixel circuit PC1 are illustrated, and a portion of the second light emitting element LD1 and a portion of the second pixel circuit PC2 are illustrated. A silicon transistor S-TFT illustrated in FIG. 8B may be the sixth transistor T6 illustrated in FIG. 6A.

Referring to FIG. 8A, a barrier layer 10br may be disposed on a base layer 110. The barrier layer 10br prevents foreign substances from being introduced from the outside. The barrier layer 10br may include at least one inorganic layer. The barrier layer 10br may include a silicon oxide layer and a silicon nitride layer. Each of the silicon oxide layer and the silicon nitride layer may be provided in plurality, and silicon oxide layers and silicon nitride layers may be alternately laminated.

In an embodiment, a first shielding electrode BMLa may be disposed on the barrier layer 10br. The first shielding electrode BMLa may include a metal. The first shielding electrode BMLa may include molybdenum (Mo) with high heat resistance, an alloy containing molybdenum, titanium (Ti), or an alloy containing titanium. The first shielding electrode BMLa may receive a bias voltage. The first shielding electrode BMLa may receive the first power voltage ELVDD. The first shielding electrode BMLa may prevent an electrical potential due to polarization from affecting the silicon transistor S-TFT. The first shielding electrode BMLa may stop external light from reaching the silicon transistor S-TFT. In an embodiment of the invention, the first shielding electrode BMLa may be a floating electrode in an isolated form from another electrode or line.

A buffer layer 10bf may be disposed on the barrier layer 10br. The buffer layer 10bf may prevent a phenomenon in which metal atoms or impurities from the base layer 110 diffuse into a first semiconductor pattern SC1 on an upper side. The buffer layer 10bf may include at least one inorganic layer. The buffer layer 10bf may include a silicon oxide layer and a silicon nitride layer.

In an embodiment, the first semiconductor pattern SC1 may be disposed on the buffer layer 10bf. The first semiconductor pattern SC1 may include a silicon semiconductor. In an embodiment, for example, the silicon semiconductor may include amorphous silicon, polycrystalline silicon, or the like. In an embodiment, for example, the first semiconductor pattern SC1 may include low-temperature polysilicon.

FIG. 8A illustrates only a portion of the first semiconductor pattern SC1, and the first semiconductor pattern SC1 may be further disposed in other regions. The first semiconductor pattern SC1 may be arranged across pixels according to a specific rule. The first semiconductor pattern SC1 may have different electrical properties depending on whether or not being doped. The first semiconductor pattern SC1 may include a first region having high conductivity and a second region having low conductivity. The first region may be doped with an N-type dopant or a P-type dopant. A P-type transistor may include a doped region which has been doped with the P-type dopant, and an N-type transistor may include a doped region which has been doped with the N-type dopant. The second region may be a non-doped region, or a region doped to a concentration lower than that of the first region.

The conductivity of the first region may be greater than the conductivity of the second region, and the first region may substantially serve as an electrode or a signal line. The second region may substantially correspond to a channel region (or an active region) of a transistor. In an embodiment, a portion of the first semiconductor pattern SC1 may be a channel of a transistor, and another portion thereof may be a source or a drain of the transistor, and the other portion thereof may be a connection electrode or a connection signal line.

A source region SE1, a channel region AC1 (or an active region), and a drain region DE1 of the silicon transistor S-TFT may be formed from (or defined by portions of) the first semiconductor pattern SC1. The source region SE1 and the drain region DE1 may extend in opposite directions from the channel region AC1 on a cross section.

In an embodiment, a first insulation layer 10 may be disposed on the buffer layer 10bf. The first insulation layer 10 may cover the first semiconductor pattern SC1. The first insulation layer 10 may be an inorganic layer. The first insulation layer 10 may be a single-layered silicon oxide layer. The first insulation layer 10 may have a multi-layered structure as well as a single-layer structure. An inorganic layer of a circuit layer 120 to be described later may have a single-layered or multi-layered structure, and may include at least one selected from the above-described materials, but the embodiment of the invention is not limited thereto.

In an embodiment, a gate GT1 of the silicon transistor S-TFT is disposed on the first insulation layer 10. The gate GT1 may be a portion of a metal pattern. The gate GT1 overlaps the channel region AC1. In a process of doping the first semiconductor pattern SC1, the gate GT1 may be a mask. On the first insulation layer 10, a first electrode CE10 of a storage capacitor Cst is disposed. Alternatively, the first electrode CE10 may have a shape of a single body with the gate GT1, that is, may be integrally formed with the gate GT1 as a single unitary and indivisible part.

In an embodiment, a second insulation layer 20 is disposed on the first insulation layer 10 to cover the gate GT1. Although not illustrated, an upper electrode overlapping the gate GT1 may be disposed on the second insulation layer 20. In such an embodiment, a second electrode CE20 overlapping the first electrode CE10 may be disposed on the second insulation layer 20.

In an embodiment, a second shielding electrode BMLb is disposed on the second insulation layer 20. The second shielding electrode BMLb may be disposed corresponding to a lower portion of the oxide transistor O-TFT. In an alternative embodiment of the invention, the second shielding electrode BMLb may be omitted. In such an embodiment of the invention, the first shielding electrode BMLa may extend to a lower portion of the oxide transistor O-TFT and replace the second shielding electrode BMLb.

In an embodiment, a third insulation layer 30 may be disposed on the second insulation layer 20. A second semiconductor pattern SC2 may be disposed on the third insulation layer 30. The second semiconductor pattern SC2 may include a channel region AC2 of the oxide transistor O-TFT. The second semiconductor pattern SC2 may include an oxide semiconductor. The second semiconductor pattern SC2 may include a transparent conductive oxide (TCO) such as an indium tin oxide (ITO), an indium zinc oxide (IZO), an indium gallium zinc oxide (IGZO), a zinc oxide (ZnOx), an indium oxide (In$_2$O$_3$), or the like.

The oxide semiconductor may include a plurality of regions which are distinguished depending on whether a transparent conductive oxide has been reduced or not. A region in which the transparent conductive oxide has been reduced (hereinafter, a reduction region) has greater conductivity than a region in which the transparent conductive oxide has not been reduced (hereinafter, a non-reduction region). The reduction region substantially serves as a source/drain or signal line of a transistor. The non-reduction region substantially corresponds to a semiconductor region (or channel) of a transistor. In an embodiment, a partial region of the second semiconductor pattern SC2 may be a semiconductor region of a transistor, another partial region thereof may be a source region/drain region of the transistor, and the other partial region thereof may be a signal transmissive region.

In an embodiment, a fourth insulation layer 40 may be disposed on the third insulation layer 30. As illustrated in FIG. 8A, the fourth insulation layer 40 overlaps a gate GT2 of the oxide transistor O-TFT, and may be an insulation pattern exposed by a source region SE2 and a drain region DE2 of the oxide transistor O-TFT. In an embodiment of the invention, the fourth insulation layer 40 commonly overlaps a plurality of pixels, and may cover the second semiconductor pattern SC2.

In an embodiment, a gate GT2 of the oxide transistor O-TFT is disposed on the fourth insulation layer 40. The gate GT2 of the oxide transistor O-TFT may be a portion of a metal pattern. The gate GT2 of the oxide transistor O-TFT overlaps the channel region AC2.

In an embodiment, a fifth insulation layer 50 is disposed on the fourth insulation layer 40, and the fifth insulation layer 50 may cover the gate GT2. The first insulation layer 10 to the fifth insulation layer 50 may each be an insulation layer.

A first connection electrode CNE1 may be disposed on the fifth insulation layer 50. The first connection electrode CNE1 may be connected to the drain region DE1 of the silicon transistor S-TFT through a contact-hole defined through the first to fifth insulation layers 10, 20, 30, 40, and 50.

A sixth insulation layer 60 may be disposed on the fifth insulation layer 50. A second connection electrode CNE2 may be disposed on the sixth insulation layer 60. The second connection electrode CNE2 may be connected to the first connection electrode CNE1 through a contact-hole defined through the sixth insulation layer 60. On the sixth insulation layer 60, the data line DL may be disposed. A seventh insulation layer 70 is disposed on the sixth insulation layer 60, and may cover the second connection electrode CNE2 and the data line DL. The sixth insulation layer 60 and the seventh insulation layer 70 may each be an organic layer.

The fifth light emitting element LD5 may include an anode AE5 (or a first electrode), a light emitting layer EL5, and a cathode CE (or a second electrode). A cathode CE of the first light emitting element LD1 to the fourth light emitting element LD4 to be described later may have a shape of a single body with the cathode CE of the first light emitting element LD5. That is, the cathode CE may be commonly provided to the first light emitting element LD1 to fifth light emitting element LD5.

The anode AE5 of the fifth light emitting element LD5 may be disposed on the seventh insulation layer 70. The anode AE5 may be a (semi)transmissive electrode or a reflective electrode. A pixel definition film PDL may be disposed on the seventh insulation layer 70. The pixel definition film PDL may have properties of absorbing light, and for example, the pixel definition film PDL may have a black color. The pixel definition film PDL may include a black coloring agent. The black coloring agent may include a black dye and a black pigment. The black coloring agent may include a metal such as carbon black or chromium, or an oxide thereof. The pixel definition film PDL may correspond to a light blocking pattern having light blocking properties.

The pixel definition film PDL may cover a portion of the anode AE5. In an embodiment, for example, the pixel definition film PDL may have an opening PDL-OP defined thereon, which exposes a portion of the anode AE5.

Although not illustrated, a hole control layer may be disposed between the anode AE5 and the light emitting layer EL5. The hole control layer includes a hole transport layer, and may further include a hole injection layer. An electron control layer may be disposed between the light emitting layer EL5 and the cathode CE. The electron control layer may include an electron transport layer, and may further include an electron injection layer. The hole control layer and the electron control layer may be commonly formed in the plurality of pixels PX (see FIG. 3) using an open mask.

The encapsulation layer 140 may be disposed on the light emitting element layer 130. The encapsulation layer 140 may include an inorganic layer 141, an organic layer 142, and an inorganic layer 143 sequentially stacked, but layers constituting the encapsulation layer 140 are not limited thereto.

The inorganic layers 141 and 143 may protect the light emitting element layer 130 from moisture and oxygen, and the organic layer 142 may protect the light emitting element layer 130 from foreign materials such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylic organic layer, but is not limited thereto.

The input sensor ISP may be disposed on the display panel DP. The input sensor ISP may include at least one conductive layer and at least one insulation layer. In an embodiment, the input sensor ISP may include a first sensing insulation layer 210, a first sensing conductive layer 220, a second sensing insulation layer 230, and a second sensing conductive layer 240.

The first sensing insulation layer 210 may be directly disposed on the display panel DP. The first sensing insulation layer 210 may be an inorganic layer including at least one selected from a silicon nitride, a silicon oxynitride, and a silicon oxide. Each of the first sensing conductive layer 220 and the second sensing conductive layer 240 may have a single-layered structure, or a multi-layered structure in which layers are laminated along the third direction DR3. The first sensing conductive layer 220 and the second sensing conductive layer 240 may include connection electrodes which define an electrode in a mesh shape. A conductive line of the first sensing conductive layer 220 and a conductive line of the second sensing conductive layer 240 may be connected though a contact-hole defined through the second sensing insulation layer 230, or may not be connected. Depending on the type of a sensor provided as the input sensor ISP, the connection relationship between the conductive line of the first sensing conductive layer 220 and the conductive line of the second sensing conductive layer 240 may be determined.

The first sensing conductive layer 220 and the second sensing conductive layer 240 which have a single-layered structure may include a metal layer or a transparent conductive layer. The metal layer may include molybdenum, silver, titanium, copper, aluminum, or an alloy thereof. The transparent conductive layer may include a transparent conductive oxide such as an indium tin oxide (ITO), an indium zinc oxide (IZO), a zinc oxide (ZnOx), an indium tin zinc oxide (ITZO), or the like. In addition, the transparent conductive layer may include a conductive polymer such as PEDOT, a metal nanowire, graphene, or the like.

The first sensing conductive layer 220 and the second sensing conductive layer 240 which have a multi-layered structure may include metal layers. The metal layers may have, for example, a three-layered structure of titanium/ aluminum/titanium. A conductive layer of a multi-layered structure may include at least one metal layer and at least one transparent conductive layer. The second sensing insulation layer 230 may be disposed between the first sensing conductive layer 220 and the second sensing conductive layer 240.

The anti-reflection layer ARL may be disposed on the input sensor ISP. The anti-reflection layer ARL may include a partition layer 310, a color filter 320, and a planarization layer 330.

A material constituting the partition layer 310 is not particularly limited as long as it is a material which absorbs light. The partition layer 310 is a layer having a black color, and in an embodiment, the partition layer 310 may include a black coloring agent. The black coloring agent may include a black dye and a black pigment. The black coloring agent may include a metal such as carbon black or chromium, or an oxide thereof.

The partition layer 310 may cover the second sensing conductive layer 240 of the input sensor ISP. The partition layer 310 may prevent external light reflection by the second sensing conductive layer 240. An opening 310-OP may be defined in the partition layer 310. The opening 310-OP may overlap an anode AE1. The color filter 320 may overlap the opening 310-OP. The color filter 320 may come into contact with the partition layer 310.

The planarization layer 330 may cover the partition layer 310 and the color filter 320. The planarization layer 330 may include an organic substance, and a flat surface may be provided on an upper surface of the planarization layer 330. In an alternative embodiment of the invention, the planarization layer 330 may be omitted.

In FIG. 8B and FIG. 8C, unlike the fifth pixel circuit PC5 and the second pixel circuit PC2, an oxide transistor O-TFT of the first pixel circuit PC1 is not shown. Any repetitive detailed description of the same or like features of the first pixel PX1 and the second pixel PX2 as those of the fifth pixel PX5 described with reference to FIG. 8A will be omitted.

Referring to FIG. 8B, while the first light emitting element LD1 and the first pixel circuit PC1 are both disposed in the first partial region P1, the first light emitting element LD1 and the first pixel circuit PC1 may be disposed to overlap each other on a plane. An anode AE2 of the second light emitting element LD2 disposed in the second partial region P2 may be electrically connected to the second pixel circuit PC2 disposed in the first partial region P1. The anode AE2 of the second light emitting element LD2 may be electrically connected to the silicon transistor S-TFT or the oxide transistor O-TFT. FIG. 8B illustrates the anode AE2 of the second light emitting element LD2 connected to the silicon transistor S-TFT.

A line portion LP of the anode AE2 of the second light emitting element LD2 may extend from an electrode portion EP overlapping the opening PDL-OP. The line portion LP may be electrically connected to the second pixel circuit PC2 through connection electrodes CNE1' and CNE2'.

Referring to FIG. 8C, a first connection line TWL1, which connects the anode AE2 of the second light emitting element LD2 and the second pixel circuit PC2 to each other, may be further disposed. The first connection line TWL1 may be disposed in a layer different from the layer in which the anode AE2 is disposed. As shown in FIG. 8C, the first connection line TWL1 may be disposed between the sixth insulation layer 60 and the seventh insulation layer 70. The first connection line TWL1 may be connected to the anode AE2 and the connection electrode CNE1' through contact-holes. Since the first connection line TWL1 is disposed, short-circuiting with an anode of another light emitting element may be effectively prevented.

In FIG. 8D, unlike the second third pixel circuit PC3-2, an oxide transistor O-TFT of the first third pixel circuit PC3-1 and an oxide transistor O-TFT of the second fourth pixel circuit PC4-2 are not shown. hereinafter, any repetitive detailed description of the same or like features of the third pixel PX3 and the fourth pixel PX4 as those of the first pixel PX1, the second pixel PX2, and the fifth pixel PX5 will be omitted.

Referring to FIG. 8D, while the first third light emitting element LD3-1 and the first third pixel circuit PC3-1 are both disposed in the third partial region P3, the first third light emitting element LD3-1 and the first third pixel circuit PC3-1 may be disposed to overlap each other on a plane. While the second third light emitting element LD3-2 and the second third pixel circuit PC3-2 are both disposed in the third partial region P3, the second third light emitting element LD3-2 and the second third pixel circuit PC3-2 may be disposed so as not to overlap each other on a plane. An anode AE3-2 of the second third light emitting element LD3-2 may be electrically connected the connection electrode CNE1' through a second connection line TWL2. However, the embodiment of the invention is not limited thereto. Alternatively, the second connection line TWL2 may be omitted, and as illustrated in FIG. 8B, an extended line portion may be included such that the anode AE3-2 is connected to a connection electrode without a separate connection line.

An anode AE4-2 of the second fourth light emitting element LD4-2 disposed in the fourth partial region P4 may be electrically connected to the second fourth pixel circuit PC4-2 disposed in the third partial region P3. The anode AE4-2 of the second fourth light emitting element LD4-2 may be electrically connected to the silicon transistor S-TFT or the oxide transistor O-TFT. FIG. 8D illustrates the anode AE4-2 of the second fourth light emitting element LD4-2 connected to the silicon transistor S-TFT. The anode AE4-2 of the second fourth light emitting element LD4-2 may be electrically connected the connection electrode CNE1' through a third connection line TWL3 disposed between the sixth insulation layer 60 and the seventh insulation layer 70. However, the embodiment of the invention is not limited thereto. Alternatively, the third connection line TWL3 may be omitted, and as illustrated in FIG. 8B, an extended line portion may be included such that the anode AE4-2 is connected to a connection electrode without a separate connection line.

Referring to FIG. 7B, FIG. 7C, FIG. 8C, and FIG. 8D together, since the first separation distance sd1, which is a separation distance between the second pixel circuit PC2 and the second light emitting element LD2, is less than the second separation distance sd2, which is a separation distance between the fourth pixel circuit PC4 and the fourth light emitting element LD4, an extension length of the first connection line TWL1 may be less than an extension length of the third connection line TWL3. In an alternative embodiment, unlike what is illustrated, the first connection line TWL1 and the third connection line TWL3 may be omitted. In such an embodiment, the length by which a line portion of the anode AE2 included in the second light emitting element LD2 extends may be less than the length by which a line portion of an anode included in the fourth light emitting element LD4 is extended.

Referring to FIG. 5A, FIG. 5B, FIG. 7A to FIG. 7D, and FIG. 8A to FIG. 8D together, in a display device according to an embodiment, the third display region DA3 may correspond to the folding portion PLT-F of the support plate PLT in which the plurality of openings OP are defined, the third partial region P3 of the third display region DA3 may overlap the first extension portion F-C between the plurality of openings OP, and the fourth partial region P4 may be a region overlapping each of the plurality of openings OP. the fourth partial region P4 overlapping the opening OP has low impact resistance, so that a circuit thereon may be disconnected or short-circuited by an external impact. In an embodiment, a pixel circuit may not be disposed in the fourth partial region P4 to reduce defects of the pixel circuit.

In an embodiment, as illustrated in FIG. 7B, FIG. 7C, FIG. 8B, FIG. 8C, and FIG. 8D, when there is an arrangement in which a light emitting element and a pixel circuit are spaced apart from each other, an anode may extend to connect the light emitting element and the pixel circuit which are far from each other, or a separate connection line may be provided, so that parasitic capacitance may be generated due to the extended additional line. Due to the parasitic capacitance, a portion which has the arrangement in which a light emitting element and a pixel circuit are spaced apart from each other may have reduced luminance compared to a portion, for example, a first display region, in which a light emitting element and a pixel circuit are disposed adjacent to each other.

In the display device according to an embodiment, a pixel arrangement form in which a light emitting element and a pixel circuit are spaced apart from each other may be provided by not disposing the pixel circuit in the fourth partial region P4 in the third display region DA3, while a pixel arrangement form in which the pixel circuit is not disposed in the second partial region P2 even in the display region DA2 adjacent to the third display region DA3 may be provided to reduce defects of a pixel circuit. However, a separation distance (hereinafter, a first separation distance) between a second light emitting element disposed in the second partial region P2 and a second pixel circuit disposed in the first partial region P1 may be designed to be less than a separation distance (hereinafter, a second separation distance) between a fourth light emitting element disposed in the fourth partial region P4 and a fourth pixel circuit disposed in the third partial region P3, and accordingly, the magnitude of parasitic capacitance (hereinafter, first parasitic capacitance) generated between the second light emitting element and the second pixel circuit may be less than the magnitude of parasitic capacitance (hereinafter, second parasitic capacitance) generated between the fourth light emitting element and the fourth pixel circuit. Since the magnitude of the first parasitic capacitance is less than the magnitude of the second parasitic capacitance, a luminance decrease value of the second display region DA2 may be smaller than a luminance decrease value of the third display region DA3. Therefore, the display device according to an embodiment of the invention may be designed in a way such that luminance gradually decreases in the order of the first display region DA1, the second display region DA2, and the third display region DA3, and accordingly, the problem of exposing (or visually recognizing) the boundary between a region overlapping a folding portion of a support plate and a region overlapping a support portion of the support plate due to the difference in the pixel circuit arrangement may be effectively prevented.

Figure 9A:
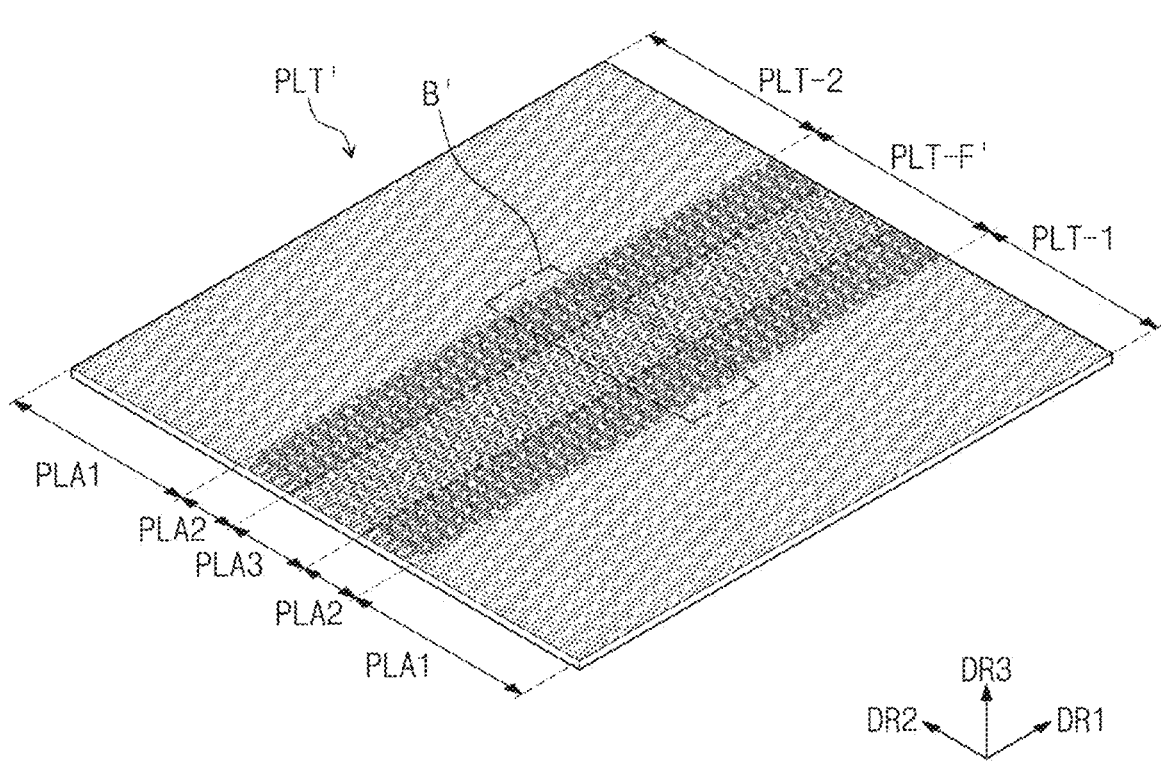
FIG. 9A is a perspective view of a support plate according to an embodiment of the invention.
Figure 9B:
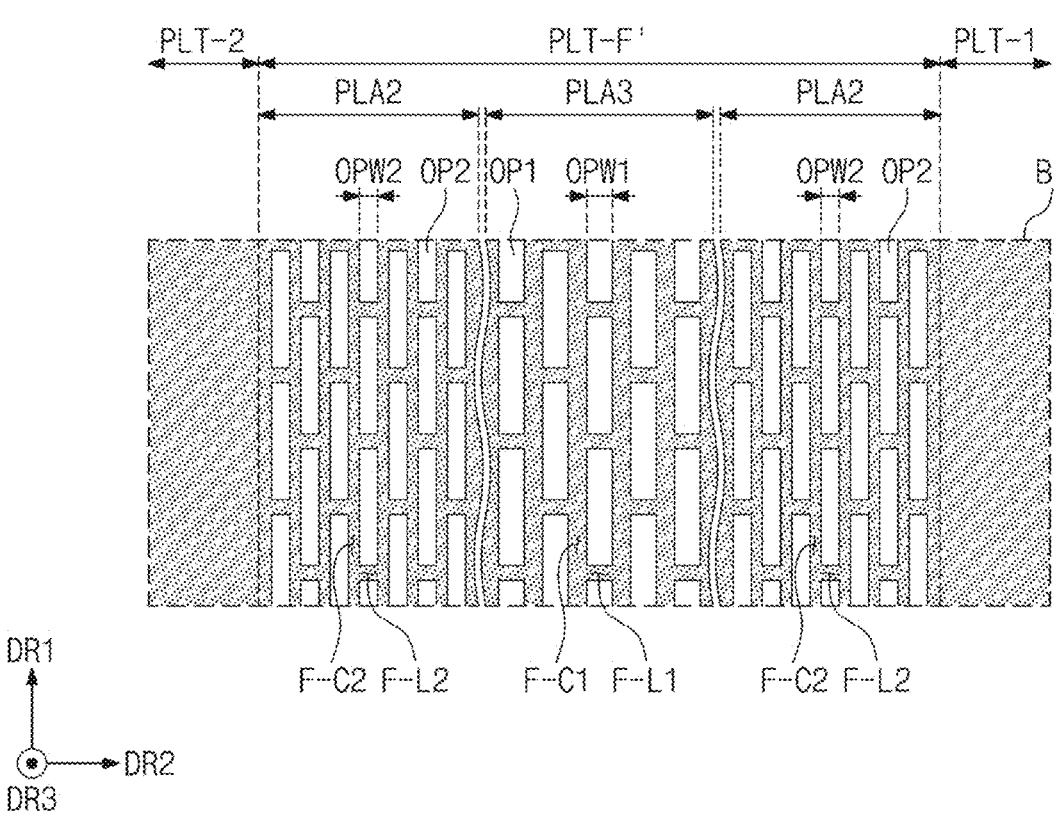
FIG. 9B is an enlarged plan view of a portion of a support plate according to an embodiment of the invention.

FIG. 9A is a perspective view of a support plate according to an embodiment of the invention. FIG. 9B is an enlarged plan view of a portion of a support plate according to an embodiment of the invention. FIG. 9B illustrates a plane corresponding to region B' of FIG. 9A. FIG. 9A and FIG. 9B illustrate a support plate of an embodiment, which is different from the support plate illustrated in FIG. 5B and FIG. 5C.

Referring to FIG. 9A and FIG. 9B together, a support plate PLT' according to an embodiment includes a first support portion PLT-1, a second support portion PLT-2, and a folding portion PLT-F', and in each of the first support portion PLT-1 and the second support portion PLT-2, a first region PLA1 may be defined, and in the folding portion PLT-F', a second region PLA2 and a third region PLA3 may be defined. The first region PLA1 may be a region corresponding to the first display region DA1 in the display region DP-DA of the display panel DP described above with reference to FIG. 3. The second region PLA2 may be a region corresponding to the second display region DA2 in the display region DP-DA of the display panel DP. The third region PLA3 may be a region corresponding to the third display region DA3 in the display region DP-DA of the display panel DP. The first support portion PLT-1, the second support portion PLT-2, and the folding portion PLT-F' may have a shape of a single body or be integrally formed with each other as a single unitary and indivisible part. In the folding portion PLT-F', a plurality of openings OP1 and OP2 may be defined.

In the third region PLA3 of the folding portion PLT-F', a plurality of first openings OP1 may be defined. A support region excluding the plurality of first openings OP1 may include first first extension portions F-C1 and first second extension portions F-L1. In the second region PLA2 of the folding portion PLT-F', a plurality of second openings OP2 may be defined. A support region excluding the plurality of second openings OP2 may include second first extension portions F-C2 and second second extension portions F-L2.

In an embodiment, a width OPW1 of each of the first openings OP1 in the second direction DR2 may be greater than a width OPW2 of each of the second openings OP2 in the second direction DR2. In the same manner, the width of each of the first first extension portions F-C1 in the second direction DR2 may be greater than the width of each of the second first extension portions F-C2 in the second direction DR2. The third partial region P3 described above with reference to FIG. 7C may be a region overlapping the first first extension portion F-C1, and the fourth partial region P4 may be a region overlapping the first opening OP1. The first partial region P1 described above with reference to FIG. 7B may be a region overlapping the second first extension portion F-C2, and the second partial region P2 may be a region overlapping the second opening OP2. As described above with reference to FIG. 7B and FIG. 7C, since the width of each of the third partial region P3 and the fourth partial region P4 in the second direction DR2 is greater than the width of each of the first partial region P1 and the second partial region P2 in the second direction DR2, respectively, the width OPW1 of each of the first openings OP1 in the second direction DR2 may be greater than the width OPW2 of each of the second openings OP2 in the second direction DR2, and the width of each of the first first extension portions F-C1 in the second direction DR2 may be greater than the width of each of the second first extension portions F-C2 in the second direction DR2.

Figure 10A:
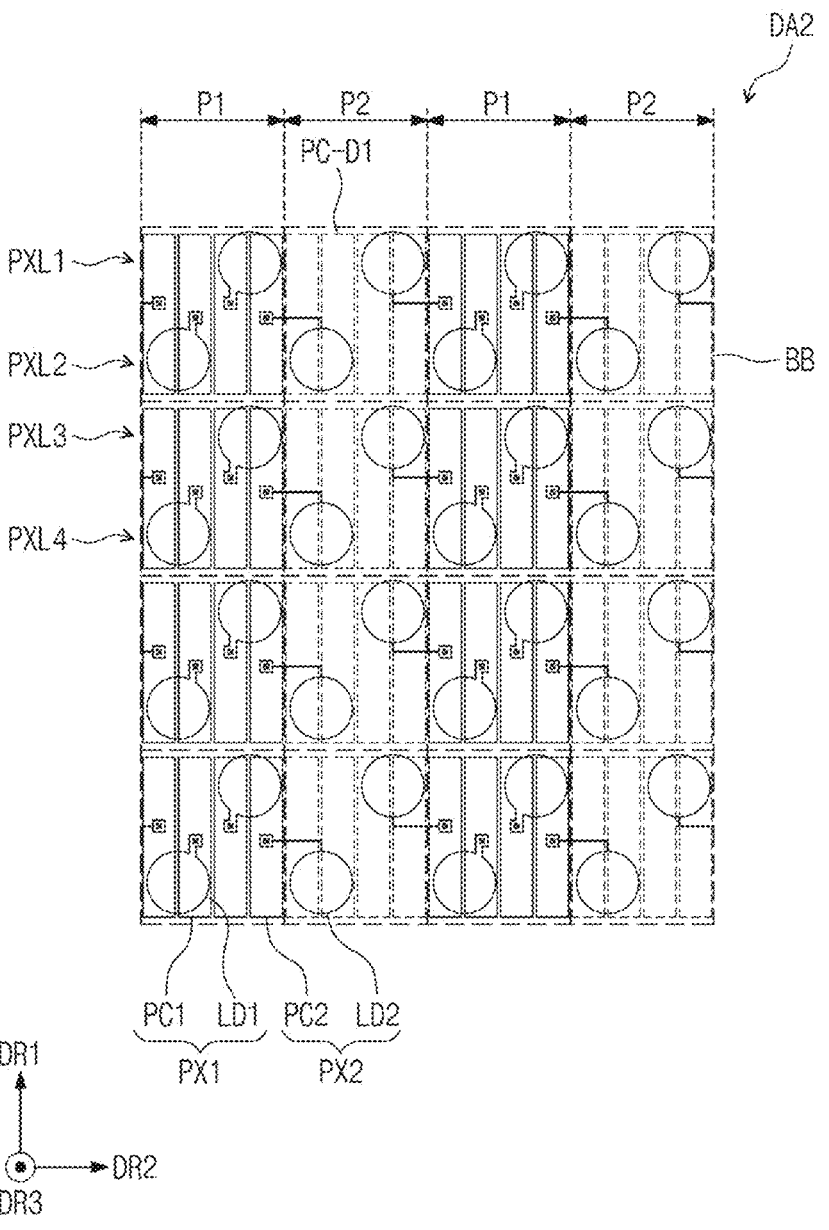
FIG. 10A is an enlarged plan view of a portion of a second display region according to an embodiment of the invention.
Figure 10B:
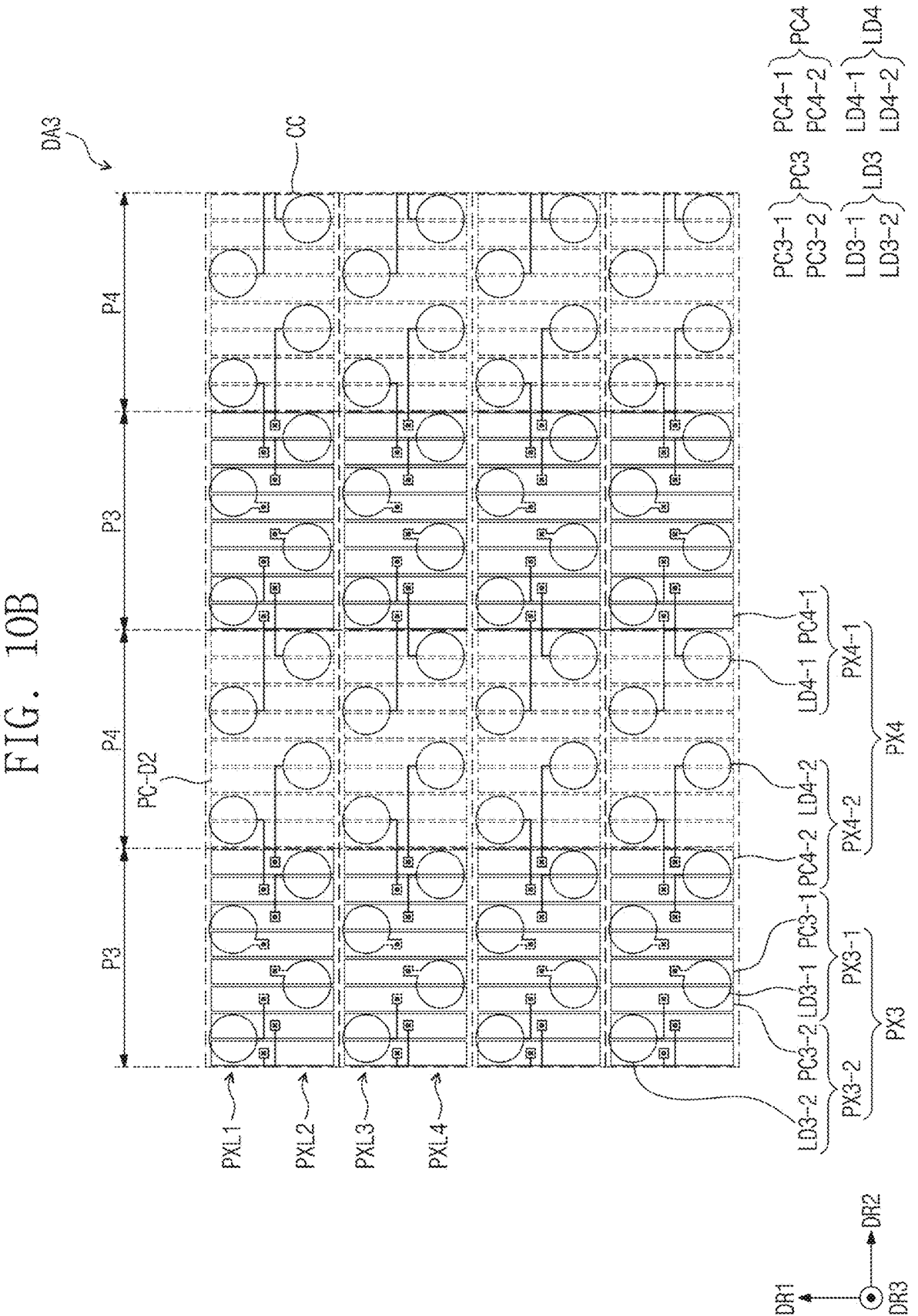
FIG. 10B is an enlarged plan view of a portion of a third display region according to an embodiment of the invention.
Figure 10C:
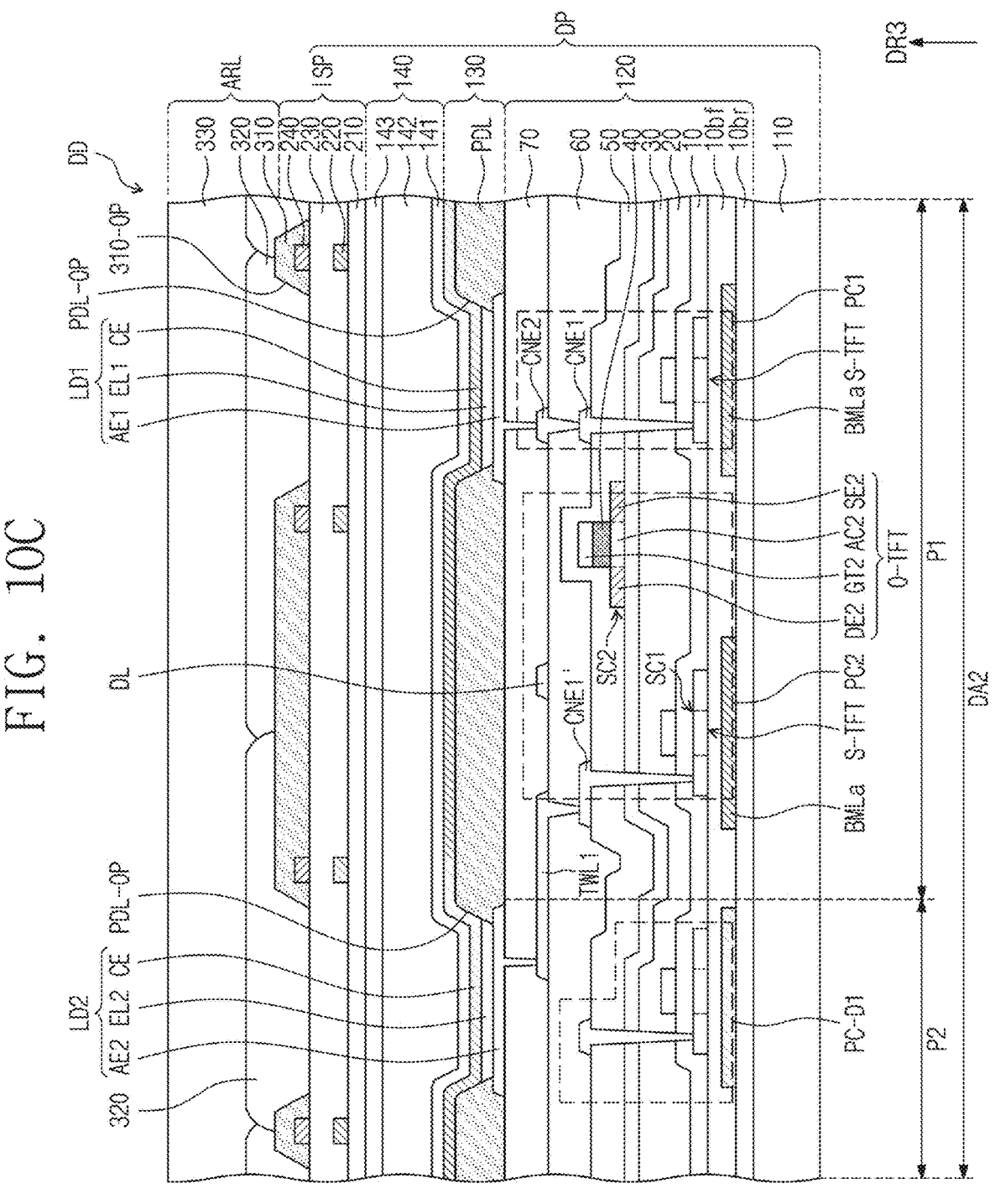
FIG. 10C is a cross-sectional view of a second display region according to an embodiment of the invention.
Figure 10D:
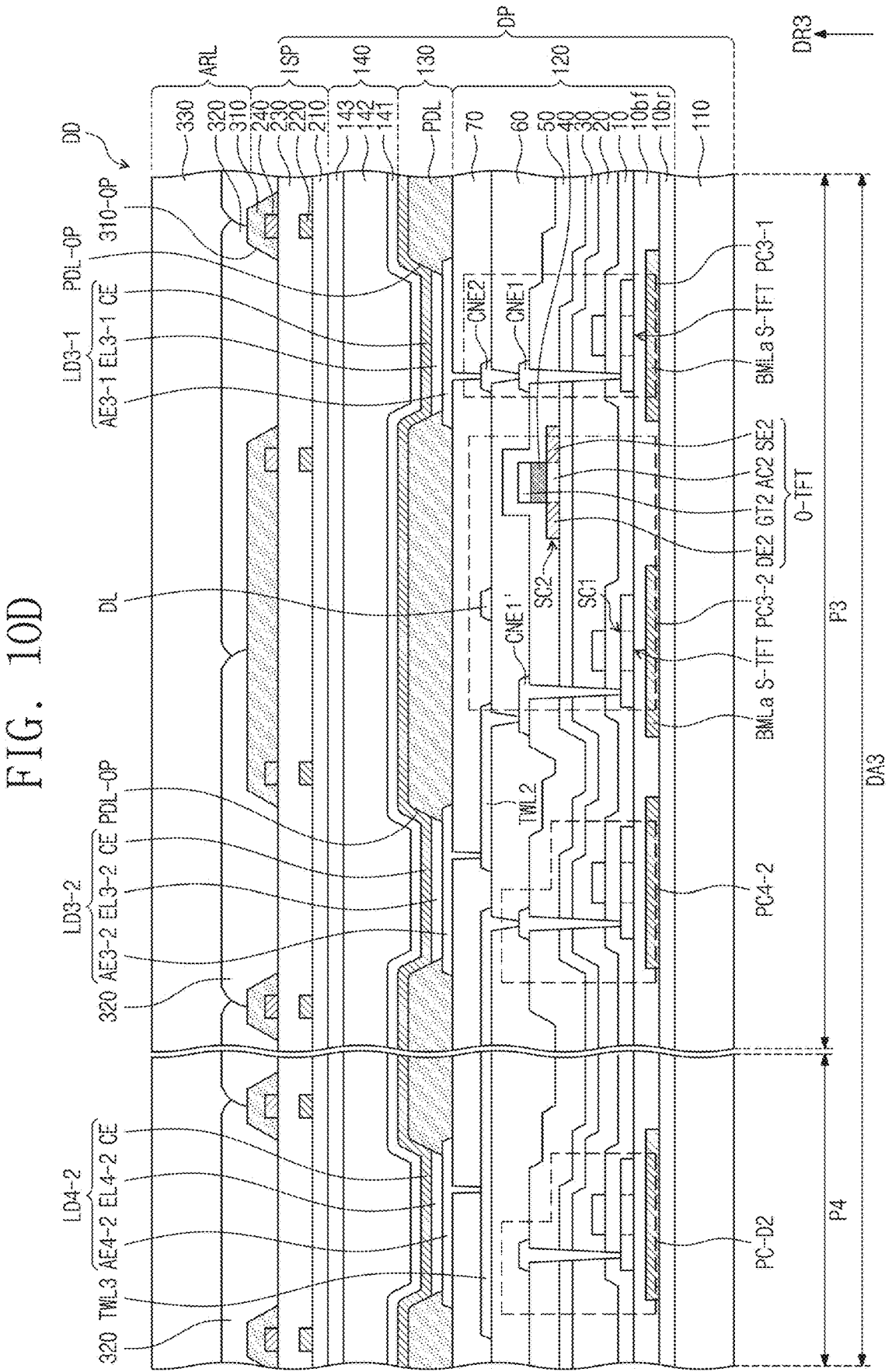
FIG. 10D is a cross-sectional view of a third display region according to an embodiment of the invention.

FIG. 10A is an enlarged plan view of portion BB of a second display region according to an embodiment of the invention. FIG. 10B is an enlarged plan view of portion CC of a third display region according to an embodiment of the invention. FIG. 10C is a cross-sectional view of the second display region DA2 according to an embodiment of the invention. FIG. 10D is a cross-sectional view of the third display region DA3 according to an embodiment of the invention.

As illustrated in FIG. 10A to FIG. 10D, the display device according to an embodiment may further include dummy pixel circuits PC-D1 and PC-D2. The dummy pixel circuits PC-D1 and PC-D2 may be disposed in a partial region of the second display region DA2 and the third display region DA3 in which a pixel circuit is not disposed. The display device of an embodiment may include a first dummy pixel circuit PC-D1 disposed in the second partial region P2, and a second dummy pixel circuit PC-D2 disposed in the fourth partial region P4.

Each of the first dummy pixel circuit PC-D1 and the second dummy pixel circuit PC-D2 may include at least a portion of the silicon transistor S-TFT and the oxide transistor O-TFT which are described above. Each of the first dummy pixel circuit PC-D1 and the second dummy pixel circuit PC-D2 may include the semiconductor pattern, the gate, and the like, which are described above. Each of the first dummy pixel circuit PC-D1 and the second dummy pixel circuit PC-D2 may include a dummy connection electrode which is connected to a silicon transistor and the like through a contact-hole passing through insulation layers.

The first dummy pixel circuit PC-D1 may be disposed in the second partial region P2 to overlap at least a portion of the second light emitting element LD2 on a plane. In an embodiment, for example, as illustrated in FIG. 10C, the first dummy pixel circuit PC-D1 may overlap a portion of the anode AE2 of the second light emitting element LD2 on a plane. The second dummy pixel circuit PC-D2 may be disposed in the fourth partial region P4 to overlap at least a portion of the fourth light emitting element LD4 on a plane. In an embodiment, for example, as illustrated in FIG. 10D, the second dummy pixel circuit PC-D2 may overlap a portion of the anode AE4-2 of the second fourth light emitting element LD4-2 on a plane.

The number of the first dummy pixel circuits PC-D1 disposed per reference area in the second partial region P2 may be substantially the same as the number of pixel circuits disposed per reference area in the first partial region P1. In an embodiment illustrated in FIG. 10A, four first dummy pixel circuits PC-D1 may be disposed per reference area in the second partial region P2, and four pixel circuits may be disposed per reference area in the first partial region P1. When the density of the first dummy pixel circuits PC-D1 of the second partial region P2 is defined as a first dummy circuit density, the first dummy circuit density may be substantially the same as a second circuit density.

The number of the second dummy pixel circuits PC-D2 disposed per reference area in the fourth partial region P4 may be substantially the same as the number of pixel circuits disposed per reference area in the third partial region P3. In an embodiment illustrated in FIG. 10B, four second dummy pixel circuits PC-D2 may be disposed per reference area in the fourth partial region P4, and four pixel circuits may be disposed per reference area in the third partial region P3. When the density of the second dummy pixel circuits PC-D2 of the fourth partial region P4 is defined as a second dummy circuit density, the second dummy circuit density may be substantially the same as a fourth circuit density.

When there is a partial region in which a pixel circuit is not disposed by providing a pixel arrangement form in which a light emitting element and a pixel circuit are spaced apart from each other in some display regions, there may be a difference in visibility between a portion in which the pixel circuit is not disposed and a portion in which the pixel circuit is disposed. In an embodiment, in the portion in which the pixel circuit is not disposed, since a component such as a transistor included in the pixel circuit, or a component such as a contact-hole in which a connection electrode is disposed is omitted, optical properties such as transmittance may become different from those of the portion in which the pixel circuit is disposed, and accordingly, the boundary between the portion in which the pixel circuit is not disposed and the portion in which the pixel circuit is disposed may be undesirably visually recognized. In an embodiment of the invention, since the display device further includes a dummy pixel circuit disposed in a partial region in which a pixel circuit is not disposed, the problem in which the boundary between the portion in which the pixel circuit is not disposed and a portion in which the pixel circuit is disposed is visually recognized may be effectively prevented.

Figure 11A:
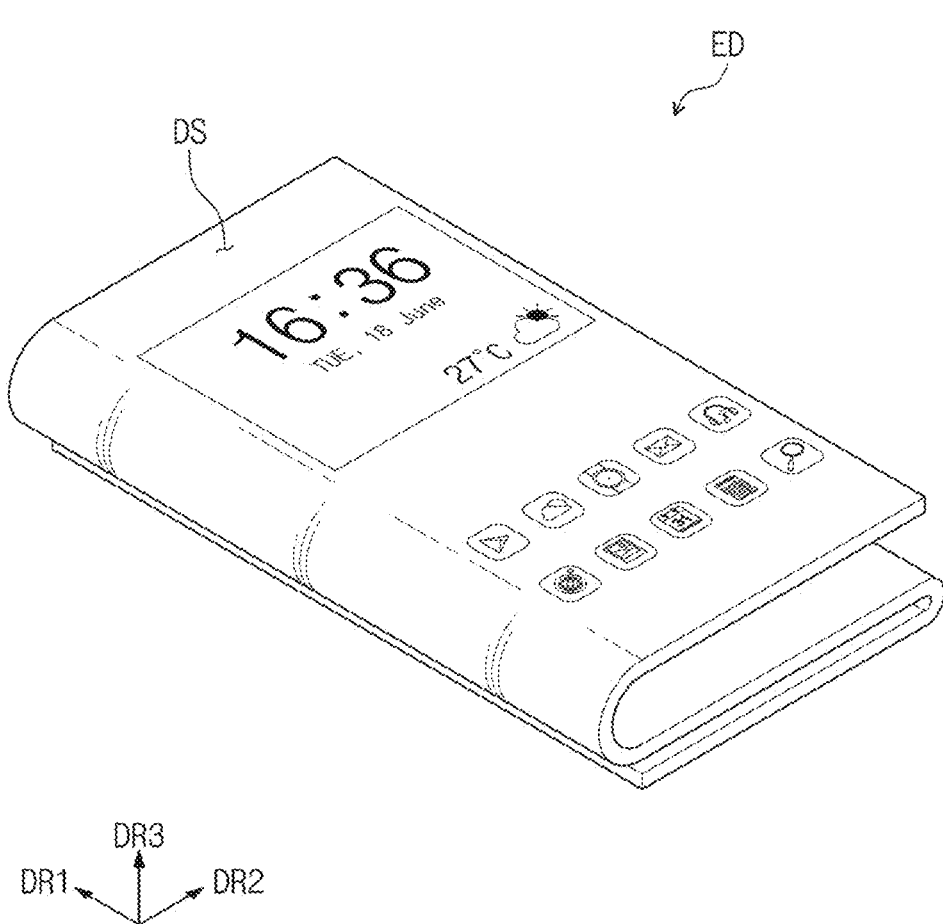
Figure 11B:
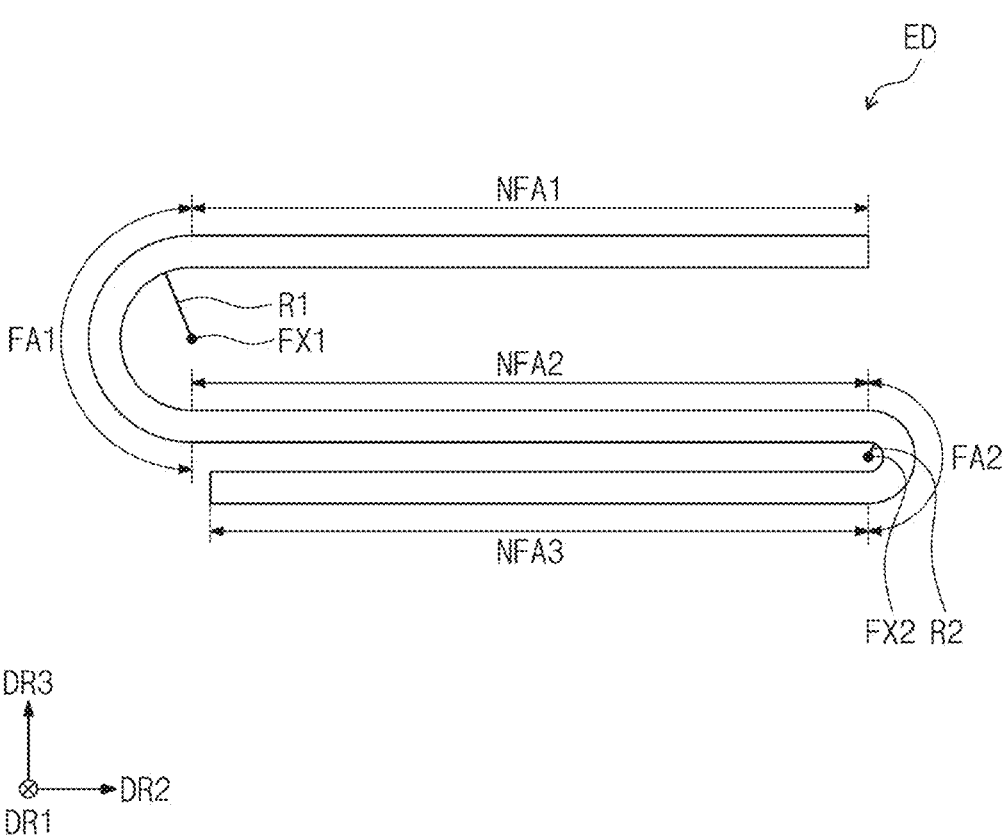
Figure 11C:
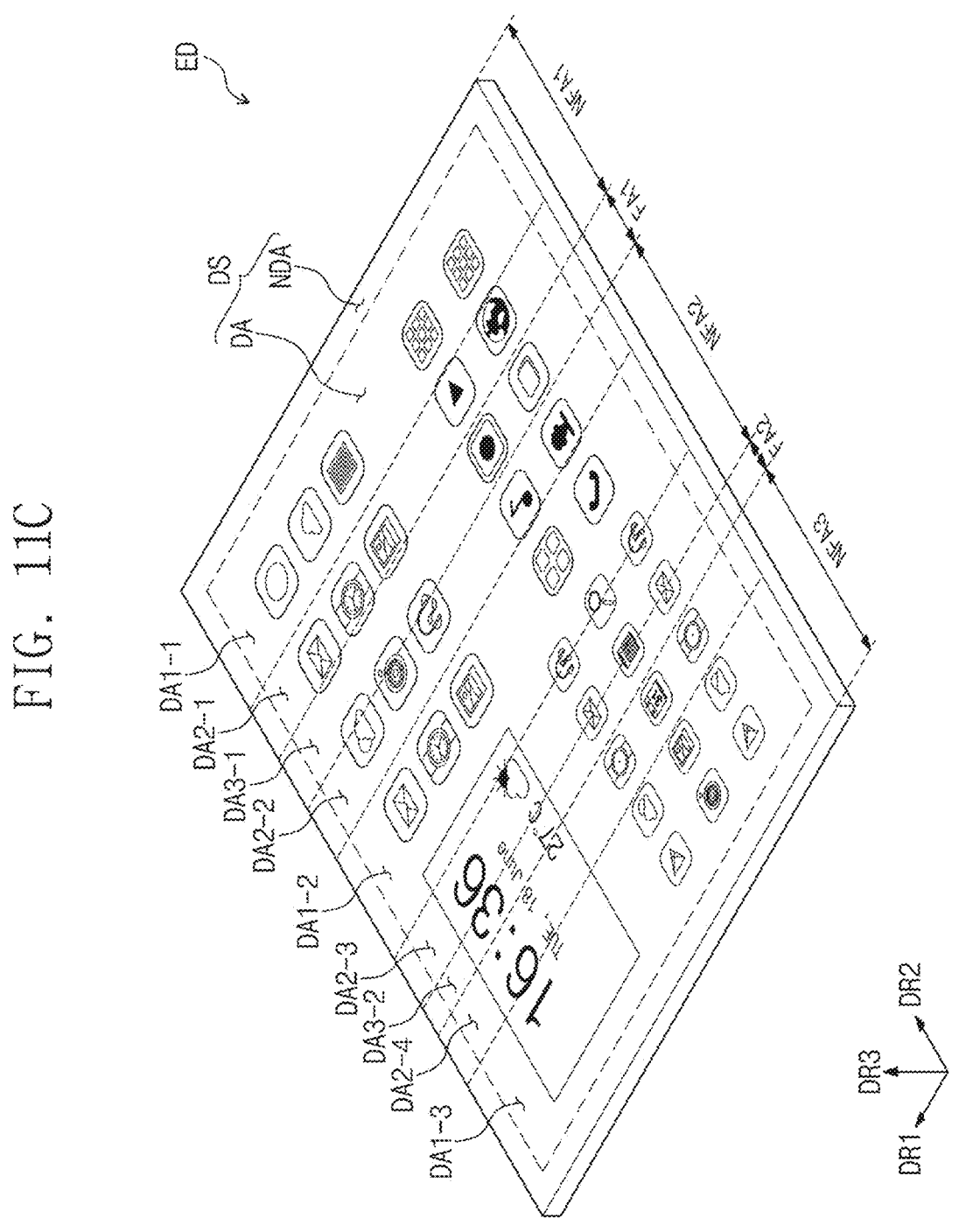

FIG. 11A to FIG. 11C are perspective views of the electronic device ED according to an embodiment of the invention.

Referring to FIG. 11A to FIG. 11C, the electronic device ED according to an embodiment of the invention may have, in an unfolded state, a rectangular shape which has long sides in the first direction DR1 and short sides in the second direction DR2 which crosses the first direction DR1. However, the embodiment of the invention is not limited thereto. The electronic device ED may have various shapes such as a circular shape and a polygonal shape.

The electronic device ED may include a plurality of folding regions FA1 and FA2 and a plurality of non-folding regions NFA1, NFA2, and NFA3. In FIGS. 11A and 11B, an embodiment of the electronic device ED including a first folding region FA1, a second folding region FA2, a first non-folding region NFA1, a second non-folding region NFA2, and a third non-folding region NFA3 is exemplarily illustrated. In the first direction DR1, the first folding region FA1 is disposed between the first non-folding region NFA1 and the second non-folding region NFA2, and the second folding region FA2 is disposed between the second non-folding region NFA2 and the third non-folding region NFA3. In FIGS. 11A and 11B, an embodiment including two folding regions FA1 and FA2 and three non-folding regions NFA1, NFA2, and NFA3 are illustrated, but the number of the folding regions FA1 and FA2 and the number of the non-folding regions NFA1, NFA2, and NFA3 are not limited thereto, and may further increase.

Referring to FIG. 11A and FIG. 11B, the first folding region FA1 may be folded with respect to a first folding axis FX1 parallel to the second direction DR2. The first folding region FA1 has a predetermined curvature and a first radius of curvature R1. A display surface of the first non-folding region NFA1 is disposed outside, and a display surface of the second non-folding region NFA2 may be outer-folded to become far from the display surface of the first non-folding region NFA1. The second folding region FA2 may be folded with respect to a second folding axis FX2 parallel to the second direction DR2. The second folding region FA2 has a predetermined curvature and a second radius of curvature R2. The display surface of the second non-folding region NFA2 may be inner-folded to become closer and to face a display surface of the third non-folding region NFA3.

The first radius of curvature R1 of the first folding region FA1 which is outer-folded may be greater than the second radius of curvature R2 of the second folding region FA2 which is inner-folded. According to the first radius of curvature R1 and the second radius of curvature R2, the width of the first folding region FA1 in the first direction DR1 and the width of the second folding region FA2 in the first direction DR1 may be determined. Therefore, the width of the first folding region FA1 in the first direction DR1 is greater than the width of the second folding region FA2 in the first direction DR1.

Referring to FIG. 11C, each of the first folding region FA1 and the second folding region FA2 may correspond to the folding region FA described with reference to FIG. 3 and the like. Third display regions DA3-1 and DA3-2 may respectively correspond to the first folding region FA1 and the second folding region FA2, and the features of the third display region DA3 described above with reference to FIG. 7C and the like may be applied to the third display regions DA3-1 and DA3-2. In the electronic device ED according to an embodiment, second display regions DA2-1, DA2-2, DA2-3, and DA2-4 may be disposed adjacent to each of the third display regions DA3-1 and DA3-2, and the third display regions DA3-1 and DA3-2 may be disposed between two adjacent second display regions DA2-1, DA2-2, DA2-3, and DA2-4. The features of the second display region DA2 described above with reference to FIG. 7B and the like may be applied to the second display regions DA2-1, DA2-2, DA2-3, and DA2-4. In the second display regions DA2-1, DA2-2, DA2-3, and DA2-4, first display regions DA1-1, DA1-2, and DA1-3 may be disposed, and the features of the first display region DA1 described above with reference to FIG. 7A and the like may be applied to the first display regions DA1-1, DA1-2, and DA1-3.

According to an embodiment of the invention, a pixel arrangement form is provided in which a pixel circuit is not disposed in a region corresponding to an opening of a support plate in a display panel, while a pixel circuit is not disposed in some regions even in a portion adjacent to a folding portion in which an opening is defined. Furthermore, an embodiment of the invention has a pixel arrangement form in which a separation distance between a pixel circuit and an light emitting element gradually increases as being closer to a folding portion, so that the problem of exposing a boundary between a region overlapping the folding portion of a support plate and a region overlapping a support portion of the support plate due to the difference in the pixel circuit arrangement may be effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a support plate including a first region, a second region adjacent to the first region, and a third region adjacent to the second region, wherein a plurality of first openings is defined in the third region, and the third region includes a first support portion between adjacent first openings of the plurality of first openings; and
a display panel divided into a first display region overlapping the first region, a second display region overlapping the second region, and a third display region overlapping the third region, wherein the display panel includes a plurality of light emitting elements and a plurality of pixel circuits,
wherein arrangements of the plurality of light emitting elements and the plurality of pixel circuits in the first display region, the second display region and the third display region are different from one another,
wherein
the plurality of pixel circuits includes a first pixel circuit, a second pixel circuit, a third pixel circuit, and a fourth pixel circuit,
the plurality of light emitting elements includes a first light emitting element connected to the first pixel circuit, a second light emitting element connected to the second pixel circuit, a third light emitting element connected to the third pixel circuit, and a fourth light emitting element connected to the fourth pixel circuit,
the second display region includes:
a first partial region in which the first pixel circuit, the second pixel circuit, and the first light emitting element are disposed; and
a second partial region in which the second light emitting element is disposed,
the third display region includes:
a third partial region in which the third pixel circuit, the fourth pixel circuit, and the third light emitting element are disposed and which overlaps at least a portion of the first support portion; and
a fourth partial region in which the fourth light emitting element is disposed, and which overlaps each of the plurality of first openings, and
wherein a first separation distance between the second pixel circuit and the second light emitting element is less than a second separation distance between the fourth pixel circuit and the fourth light emitting element.

2. The display device of claim 1, wherein the first region and the second region are defined by flat portions of the support plate, which are integrally formed with each other as a single unitary and indivisible part.

3. The display device of claim 1, wherein:
a plurality of second openings is defined in the second region,
the second region includes a second support portion between adjacent second openings of the plurality of second openings, and
a width of each of the plurality of second openings in a first direction is less than a width of each of the plurality of first openings in the first direction.

4. The display device of claim 3, wherein
the first partial region overlaps at least a portion of the second support portion, and
the second partial region overlaps each of the plurality of second openings.

5. The display device of claim 1, wherein the plurality of pixel circuits further includes a fifth pixel circuit and a fifth light emitting element electrically connected to the fifth pixel circuit, and the fifth pixel circuit and the fifth light emitting element are disposed in the first display region.

6. The display device of claim 5, wherein a planar area of the fifth pixel circuit is substantially the same as a planar area of each of the first pixel circuit to the fourth pixel circuit.

7. The display device of claim 1, wherein an arrangement of light emitting elements in the first display region is substantially the same as an arrangement of light emitting elements in the second display region and an arrangement of light emitting elements in the third display region.

8. The display device of claim 1, wherein a density of pixel circuits in the first display region is defined as a first circuit density, a density of pixel circuits in the first partial region is defined as a second circuit density, a density of pixel circuits in the second partial region is defined as a third circuit density, and the first circuit density is less than the second circuit density, and greater than the third circuit density.

9. The display device of claim 8, wherein a density of pixel circuits in the third partial region is defined as a fourth circuit density, a density of pixel circuits in the fourth partial region is defined as a fifth circuit density, and the first circuit density is less than the fourth circuit density, and greater than the fifth circuit density.

10. The display device of claim 1, wherein the display panel further comprises a first dummy pixel circuit disposed in the second partial region, and a second dummy pixel circuit disposed in the fourth partial region.

11. The display device of claim 10, wherein a density of pixel circuits in the first partial region is defined as a second circuit density, a density of first dummy pixel circuits in the second partial region is defined as a first dummy pixel density, and the second circuit density and the first dummy circuit density are substantially the same as each other.

12. The display device of claim 10, wherein a density of pixel circuits in the third partial region is defined as a fourth circuit density, a density of second dummy pixel circuits in the fourth partial region is defined as a second dummy pixel density, and the fourth circuit density and the second dummy circuit density are substantially the same as each other.

13. The display device of claim 1, wherein a width of the third partial region in a first direction is greater than a width of the first partial region in the first direction.

14. The display device of claim 1, wherein the display panel further comprises a first connection line connected between the second pixel circuit and the second light emitting element, and a second connection line connected between the fourth pixel circuit and the fourth light emitting element, wherein:

each of the first connection line and the second connection line is disposed in a different layer from the layer in which an anode of each of the second light emitting element and the fourth light emitting element is disposed; and an extension length of the second connection line in a first direction is greater than an extension length of the first connection line in the first direction.

15. The display device of claim 14, wherein a pixel circuit is not disposed in each of the second partial region and the fourth partial region.

16. The display device of claim 1, wherein the third region and the third display region are unfolded in a first mode, and folded in a second mode.

17. The display device of claim 1, wherein:

each of the first region to the third region is provided in plural; and each of a plurality of third regions is disposed between two adjacent second regions among a plurality of second regions.

18. The display device of claim 1, wherein the support plate comprises a metal.

19. The display device of claim 1, wherein the first support portion of the support plate comprises:

a plurality of first extension portions arranged in a first direction and extending in a second direction crossing the first direction; and a second extension portions disposed between adjacent first extension portions among the plurality of first extension portions, and extending in the first direction.

20. The display device of claim 19, wherein the first extension portions and the second extension portions define a grid shape.

21. A display device comprising:

a support plate including a first region, a second region adjacent to the first region, and a third region adjacent to the second region, wherein a plurality of first openings is defined in the third region, and the third region includes a first support portion between adjacent first openings of the plurality of first openings; and a display panel including a first display region overlapping the first region, a second display region overlapping the second region, and a third display region overlapping the third region, wherein the display panel includes a plurality of light emitting elements and a plurality of pixel circuits, wherein the plurality of pixel circuits includes a first pixel circuit, a second pixel circuit, a third pixel circuit, and a fourth pixel circuit;

the plurality of light emitting elements includes a first light emitting element connected to the first pixel circuit, a second light emitting element connected to the second pixel circuit, a third light emitting element connected to the third pixel circuit, and a fourth light emitting element connected to the fourth pixel circuit, the second display region includes:

a first partial region in which the first pixel circuit, the second pixel circuit, and the first light emitting element are disposed; and a second partial region in which the second light emitting element is disposed, the third display region includes:

a third partial region in which the third pixel circuit, the fourth pixel circuit, and the third light emitting element are disposed and which overlaps at least a portion of the first support portion; and a fourth partial region in which the fourth light emitting element is disposed, and which overlaps each of the plurality of first openings, wherein:

an arrangement of light emitting elements in the first display region is substantially the same as an arrangement of light emitting elements in the second display region and an arrangement of light emitting elements in the third display region; and a width of the third partial region in a first direction is greater than a width of the first partial region in the first direction.

22. A display device comprising:

a display panel divided into a first region, a second region, and a third region sequentially disposed along one direction, wherein the display panel includes a plurality of light emitting elements and a plurality of pixel circuits, wherein arrangements of the plurality of light emitting elements and the plurality of pixel circuits in the first display region, the second display region and the third display region are different from one another, wherein the first region has a constant shape when an operation mode changes, and the third region has a shape which changes according to a change of the operation mode, the plurality of pixel circuits include a first pixel circuit, a second pixel circuit, a third pixel circuit, and a fourth pixel circuit, the plurality of light emitting elements include a first light emitting element connected to the first pixel circuit, a second light emitting element connected to the second pixel circuit, a third light emitting element connected to the third pixel circuit, and a fourth light emitting element connected to the fourth pixel circuit, the second region includes:

a first partial region in which the first pixel circuit, the second pixel circuit, and the first light emitting element are disposed; and a second partial region in which the second light emitting element is disposed, the third region includes:

a third partial region in which the third pixel circuit, the fourth pixel circuit, and the third light emitting element are disposed; and a fourth partial region in which the fourth light emitting element is disposed, and wherein a first separation distance between the second pixel circuit and the second light emitting element is less than a second separation distance between the fourth pixel circuit and the fourth light emitting element.

* * * * *